(12) United States Patent
Kim et al.

(10) Patent No.: US 11,736,098 B2
(45) Date of Patent: Aug. 22, 2023

(54) MEMORY PACKAGE, SEMICONDUCTOR DEVICE, AND STORAGE DEVICE

(71) Applicant: Samsung Electronics Co., Ltd., Suwon-si (KR)

(72) Inventors: Tongsung Kim, Suwon-si (KR); Youngmin Jo, Hwaseong-si (KR); Chiweon Yoon, Seoul (KR); Byungkwan Chun, Seoul (KR); Byunghoon Jeong, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/866,517

(22) Filed: Jul. 17, 2022

(65) Prior Publication Data

US 2023/0179193 A1 Jun. 8, 2023

(30) Foreign Application Priority Data

Dec. 3, 2021 (KR) .......................... 10-2021-0172135
Mar. 2, 2022 (KR) .......................... 10-2022-0026888

(51) Int. Cl.
*H03K 5/14* (2014.01)
*H03L 7/081* (2006.01)
*H03K 5/135* (2006.01)
*H03K 5/00* (2006.01)

(52) U.S. Cl.
CPC ............... *H03K 5/14* (2013.01); *H03K 5/135* (2013.01); *H03L 7/0816* (2013.01); *H03K 2005/00247* (2013.01)

(58) Field of Classification Search
None
See application file for complete search history.

(56) References Cited

U.S. PATENT DOCUMENTS

| | | | |
|---|---|---|---|
| 5,963,606 A | * | 10/1999 | Drost .................... H04L 7/0337 327/161 |
| 6,874,097 B1 | | 3/2005 | Aliahmad et al. |
| 7,567,880 B2 | | 7/2009 | Iizuka |
| 7,679,133 B2 | | 3/2010 | Son et al. |
| 8,553,466 B2 | | 10/2013 | Han et al. |
| 8,559,235 B2 | | 10/2013 | Yoon et al. |

(Continued)

OTHER PUBLICATIONS

Extended European Search Report dated Mar. 31, 2023 for corresponding EP Patent Application No. 22206370.3.

*Primary Examiner* — Cassandra F Cox
(74) *Attorney, Agent, or Firm* — Muir Patent Law, PLLC

(57) ABSTRACT

A memory package includes a plurality of memory chips, and an interface chip relaying communications between a controller and the plurality of memory chips and receiving a plurality of signals from the plurality of memory chips. The interface chip includes receivers outputting a data signal and a raw clock signal based on the plurality of signals, a delay circuit outputting a delay clock signal by applying an offset delay corresponding to ½ of one unit interval of the data signal and an additional delay to the raw clock signal, and a sampler sampling the data signal in synchronization with a clock signal. The delay circuit outputs the clock signal generated by removing the offset delay from the delay clock signal when the delay clock signal and the data signal have a phase difference corresponding to one unit interval of the data signal.

20 Claims, 27 Drawing Sheets

(56) References Cited

U.S. PATENT DOCUMENTS

| | | |
|---|---|---|
| 8,654,587 B2 | 2/2014 | Yoon et al. |
| 8,878,792 B2 * | 11/2014 | Lim ..................... H03L 7/0816 |
| | | 345/173 |
| 9,111,599 B1 | 8/2015 | Bringivijayaraghavan |
| 9,183,125 B2 | 11/2015 | Brandi et al. |
| 10,438,637 B2 | 10/2019 | Naruse |
| 10,692,551 B2 | 6/2020 | Hwang |
| 2010/0271094 A1 * | 10/2010 | Hassan ................. H03L 7/0816 |
| | | 327/161 |
| 2011/0233648 A1 | 9/2011 | Seol et al. |
| 2016/0172013 A1 | 6/2016 | Dearth et al. |
| 2018/0233184 A1 | 8/2018 | Choi |
| 2020/0201705 A1 | 6/2020 | Kim et al. |

\* cited by examiner

MEMORY PACKAGE, SEMICONDUCTOR DEVICE, AND STORAGE DEVICE

CROSS-REFERENCE TO RELATED APPLICATION(S)

This application claims the benefit under 35 USC 119(a) of Korean Patent Application No. 10-2021-0172135 filed on Dec. 3, 2021 and Korean Patent Application No. 10-2022-0026888 filed on Mar. 2, 2022 in the Korean Intellectual Property Office, the disclosure of each of which is incorporated herein by reference in its entirety.

BACKGROUND

The present inventive concept relates to a memory package, a semiconductor device, and a storage device.

A memory package provides a function of writing and erasing data or reading recorded data in response to a control signal received from an external host, a controller or the like, and may include one or more memory chips. In order to improve a communications speed at which the memory package and the external host or the controller exchange data with each other, a structure including a memory chip and an interface chip implemented as a separate semiconductor chip has been proposed. When the interface chip is connected between the host or the controller and the memory chip, a method for removing skew between signals transmitted between the interface chip and the memory chip is would be beneficial.

SUMMARY

Example embodiments provide a memory package, a semiconductor device, and a storage device capable of optimizing a phase difference between a data signal and a clock signal that a semiconductor device such as an interface chip exchanges with a memory chip by effectively removing skew between the data signal and the clock signal.

According to example embodiments, a memory package includes a plurality of memory chips, and an interface chip configured to relay communications between a controller and the plurality of memory chips and receive a plurality of signals from the plurality of memory chips. The interface chip includes a first receiver configured to output a data signal based on a first signal of the plurality of signals, a second receiver configured to output a raw clock signal based on a second signal of the plurality of signals, a delay circuit configured to output a delay clock signal by applying an offset delay corresponding to ½ of one unit interval of the data signal and an additional delay to the raw clock signal, and output a clock signal generated by removing the offset delay from the delay clock signal when the delay clock signal and the data signal have a phase difference corresponding to one unit interval of the data signal, and a sampler configured to sample the data signal in synchronization with the clock signal output from the delay circuit.

According to example embodiments, a semiconductor device includes a first receiver configured to output a data signal based on a first input signal received from outside the semiconductor device, a second receiver configured to output a raw clock signal based on a second input signal received from outside the semiconductor device, a delay locked loop circuit configured to output a first delay code, a first sampler configured to sample the data signal in synchronization with a clock signal, a counter circuit configured to output a second delay code generated based on a signal detected in at least one of an input terminal and an output terminal of the first sampler, and a delay cell configured to output a delay clock signal generated by delaying the raw clock signal by applying delays determined based on the first delay code and the second delay code, and output the clock signal from which a delay according to the first delay code is removed when a phase difference between the data signal and the delay clock signal corresponds to one unit interval of the data signal.

According to example embodiments, a storage device includes a controller configured to sequentially execute a plurality of training operations, a memory chip configured to output a first signal and a second signal having the same phase through a first pad and a second pad, respectively, while at least one of the training operations is executed, and an interface chip connected between the controller and the memory chip, and the interface chip including a first receiver configured to output a data signal based on the first signal, a second receiver configured to output a raw clock signal based on the second signal, a first sampler configured to sample the data signal in synchronization with a clock signal, and a delay circuit configured to output a delay clock signal by applying a first delay code corresponding to a first delay determined regardless of a phase difference between the data signal and the delay clock signal detected at a respective input terminal of the first sampler and applying a second delay code corresponding to a second delay determined based on the phase difference between the data signal and the delay clock signal detected at the respective input terminal of the first sampler, and output the clock signal by removing the first delay from the delay clock signal when the delay clock signal and the data signal have a phase difference corresponding to one unit interval of the data signal.

BRIEF DESCRIPTION OF DRAWINGS

The above and other aspects, features, and advantages of the present inventive concept will be more clearly understood from the following detailed description, taken in conjunction with the accompanying drawings, in which.

DETAILED DESCRIPTION

Hereinafter, example embodiments will be described with reference to the accompanying drawings.

Figure 1:
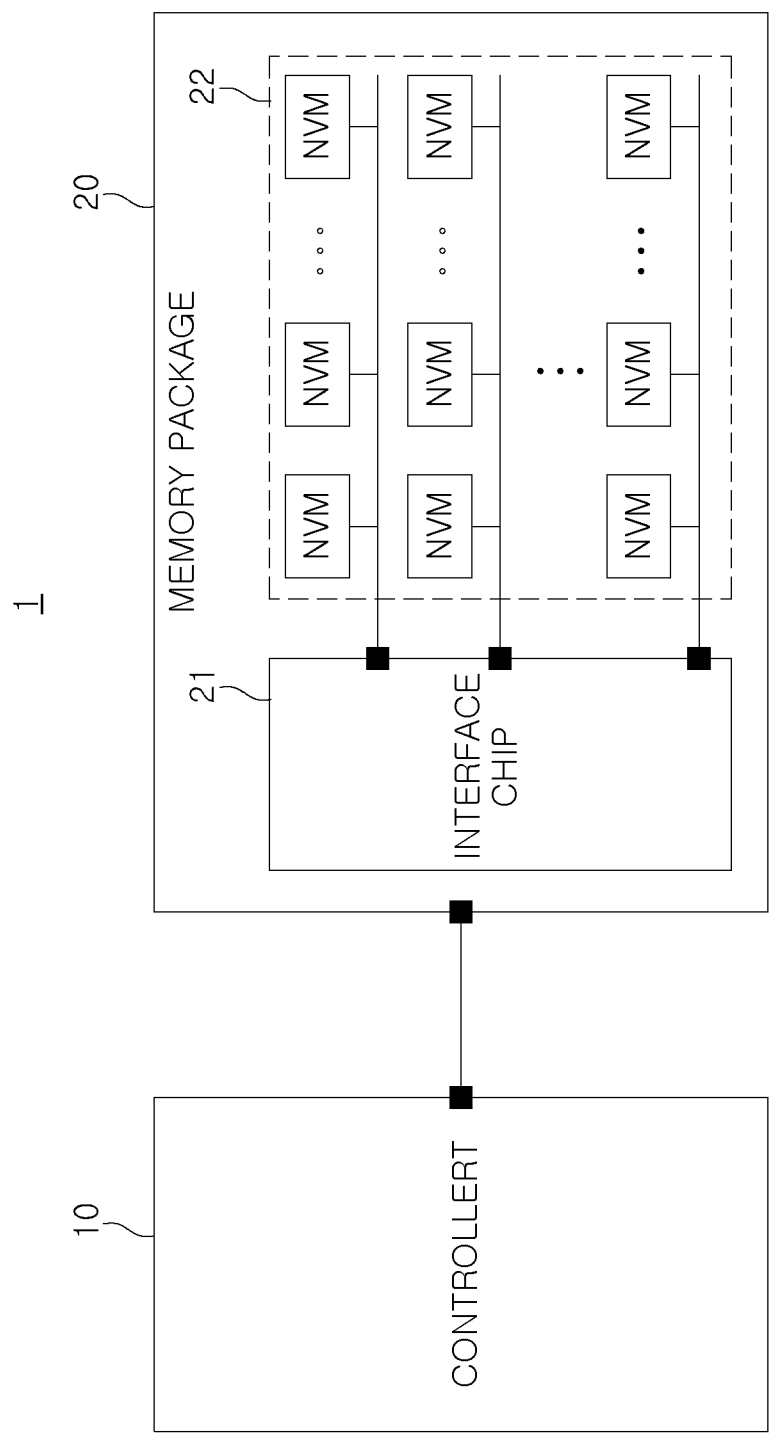
FIG. 1 is a schematic block diagram illustrating a storage device according to an example embodiment.

FIG. 1 is a schematic block diagram illustrating a storage device according to an example embodiment.

Referring to FIG. 1, a storage device 1 according to an example embodiment may include a controller 10, a memory package 20, and the like. According to an example embodiment, the storage device 1 may include two or more memory packages 20, and one controller 10 may control the two or more memory packages 20.

The controller 10 may communicate with an external host to which the storage device 1 is connected, and may read data stored in the memory package 20 and output the read data to the host or store data received from the host in the memory package 20, in response to a command signal received from the host. According to an example embodiment, the controller 10 may be mounted in a processor or the like of the host rather than the storage device 1.

The memory package 20 may include an interface chip 21 and a plurality of memory chips NVM 22. The plurality of memory chips 22 may be connected to the interface chip 21 through internal channels of the memory package 20, and as an example, two or more memory chips may be connected to one internal channel. In an example embodiment, each of the plurality of memory chips 22 may be a non-volatile memory device in which stored data is retained even though power is cut off.

The interface chip 21 may relay communications between the controller 10 and the plurality of memory chips 22. For example, the interface chip 21 may transfer a command signal, an address signal, and the like, received from the controller 10 to at least one of the plurality of memory chips 22.

A program operation for storing data in the controller 10 and the memory package 20 and/or a read operation for reading data stored in the memory package 20 may be executed in synchronization with a predetermined clock signal. As a data rate between the controller 10 and the memory package 20 increases, phases of a data signal and a clock signal that the controller 10 and the memory package 20 exchange with each other may need to be accurately aligned with each other.

As an example, when skews occur in a phase difference between the data signal and the clock signal between the controller 10 and the interface chip 21 and/or between the interface chip 21 and the plurality of memory chips 22, reliability of the storage device 1 may be deteriorated.

In addition, when the controller 10 may not know whether or not the interface chip 21 exists in the memory package 20, only the skew between the controller 10 and the interface chip 21 may be significantly decreased in a training operation executed after power is supplied to the storage device 1. In this case, the skew between the interface chip 21 and the plurality of memory chips 22 may increase, such that a problem may occur in an operation in the memory package 20.

In an example embodiment, after the power is supplied to the storage device 1, the skew may be decreased by aligning the phases of the data signal and the clock signal with each other in the internal channels between the interface chip 21 and the plurality of memory chips 22. Alternatively, the skew occurring in the internal channels of the memory package 20 may be significantly decreased without a separate training time by aligning the phases of the data signal and the clock signal with each other in the internal channels of the memory package 20 during a training operation executed by the controller 10 for the memory package 20.

According to an example embodiment, the memory package 20 may not include the interface chip 21. In this case, an operation of aligning the phases of the data signal and the clock signal with each other and significantly decreasing the skew may be executed in the controller 10.

Figure 2:
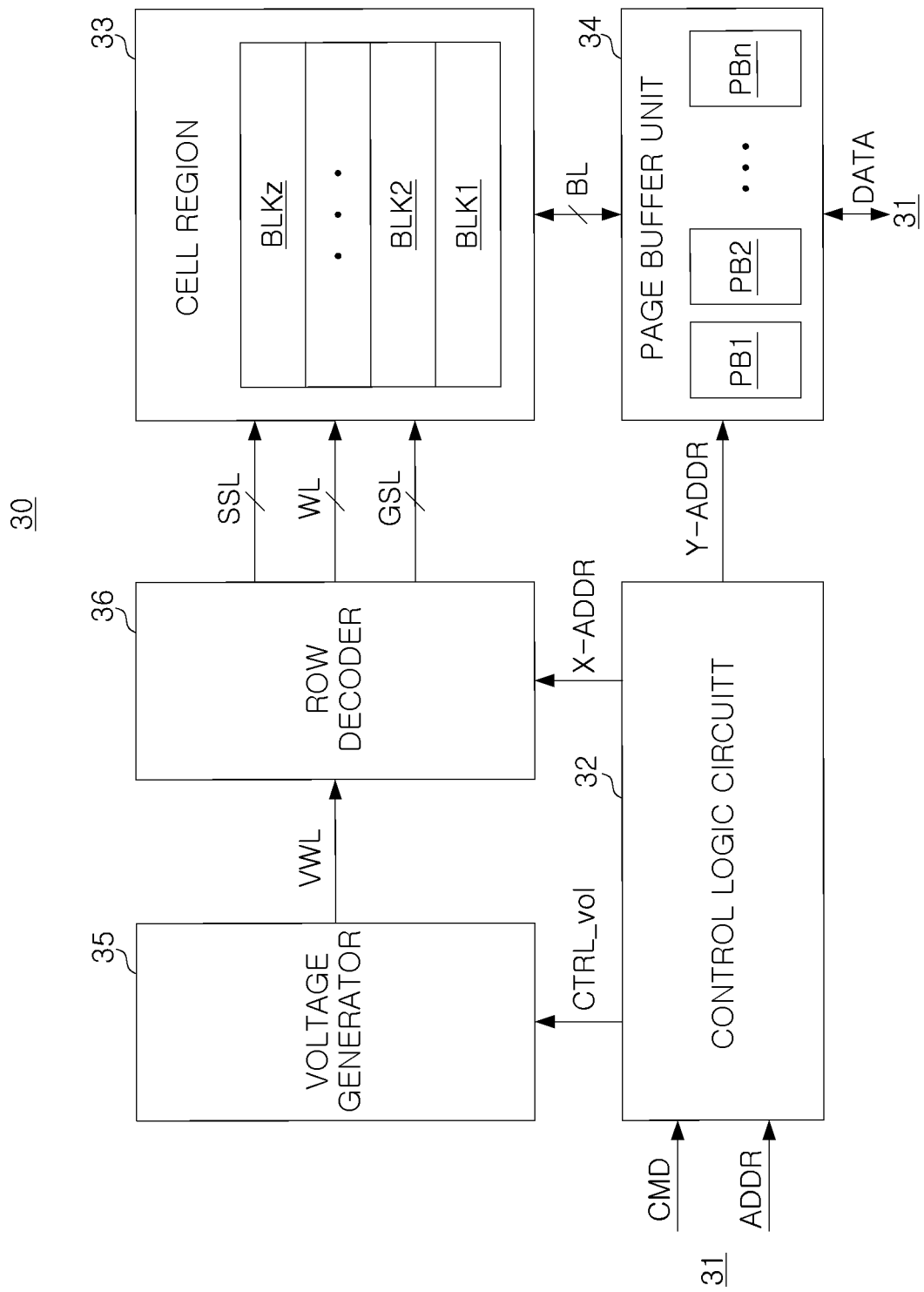
FIG. 2 is a schematic block diagram illustrating a memory device according to an example embodiment.

FIG. 2 is a schematic block diagram illustrating a memory device according to an example embodiment.

Referring to FIG. 2, a semiconductor device 30 may include a control logic circuit 32, a cell region 33, a page buffer unit 34, a voltage generator 35, and a row decoder 36. The semiconductor device 30 may further include an interface circuit 31, and may further include a column logic, a pre-decoder, a temperature sensor, a command decoder, an address decoder, a source driver, and the like. The semiconductor device 30 may be a memory device storing data, for example, a non-volatile memory device retaining stored data even when power is cut off. In example embodiments, the semiconductor device 30 may correspond to one of the plurality of memory chips 22.

The control logic circuit 32 may generally control various operations in the semiconductor device 30. The control logic circuit 32 may output various control signals in response to a command CMD and/or an address ADDR received by the interface circuit 31. For example, the control logic circuit 32 may output a voltage control signal CTRL_vol, a row address X-ADDR, and a column address Y-ADDR.

The cell region 33 may include a plurality of memory blocks BLK1 to BLKz (z is a positive integer), each of which may include a plurality of memory cells. In an example embodiment, the plurality of memory blocks BLK1 to BLKz may be isolated from each other by first isolation regions including an insulating material, and second isolation regions different from the first isolation regions may be disposed in each of the plurality of memory blocks BLK1 to BLKz. As an example, each of the second isolation regions may have a structure different from that of the first isolation regions.

As an example, the plurality of memory blocks BLK1 to BLKz may include main blocks storing data and at least one spare block storing data required for an operation of the semiconductor device 30. The cell region 33 may be connected to the page buffer unit 34 through bit lines BL, and may be connected to the row decoder 36 through word lines WL, string select lines SSL, and ground select lines GSL.

In an example embodiment, the cell region 33 may include a three-dimensional (3D) memory cell array, and the 3D memory cell array may include a plurality of NAND strings. Each NAND string may include memory cells each connected to word lines vertically stacked on a substrate. U.S. Pat. Nos. 7,679,133, 8,553,466, 8,654,587, 8,559,235, and U.S. Patent Application Publication No. 2011/0233648 are herein incorporated by reference. In an example embodiment, the cell region 33 may include a two-dimensional (2D) memory cell array, and the 2D memory cell array may include a plurality of NAND strings arranged along row and column directions.

The page buffer unit 34 may include a plurality of page buffers PB1 to PBn (n is an integer of 3 or more), and the plurality of page buffers PB1 to PBn may be connected, respectively, to the memory cells through a plurality of bit lines BL. The page buffer unit 34 may select at least one of the bit lines BL in response to the column address Y-ADDR.

The page buffer unit 34 may operate as a write driver or a sense amplifier according to an operation mode. For example, at the time of a program operation, the page buffer unit 34 may apply a bit line voltage corresponding to data to be programmed to the selected bit line. At the time of a read operation, the page buffer unit 34 may sense a current or voltage of a selected bit line to sense data stored in the memory cell. The data to be programmed into the cell region 33 by the program operation and the data read from the cell region 33 by the read operation may be input/output through the interface circuit 31.

The voltage generator 35 may generate various types of voltages for performing program, read, and erase operations based on the voltage control signal CTRL_vol. For example, the voltage generator 35 may generate a program voltage, a read voltage, a pass voltage, a program verification voltage, an erase voltage, and the like. In an example embodiment, the control logic circuit 32 may control the voltage generator 35 to generate voltages for executing the program, read, and erase operations using the data stored in the spare block. Some of the voltages generated by the voltage generator 35 may be input to the word lines WL as word line voltages VWL by the row decoder 36, and the others of the voltages may be input to a common source line by the source driver.

The row decoder 36 may select one of a plurality of word lines WL and may select one of a plurality of string selection lines SSL, in response to the row address X-ADDR. For example, the row decoder 36 may apply the program voltage and the program verification voltage to the selected word line at the time of the program operation, and may apply the read voltage to the selected word line at the time of the read operation.

FIGS. 3A, 3B, 4A, and 4B are schematic block diagrams illustrating interface chips according to example embodiments.

Figure 3A:
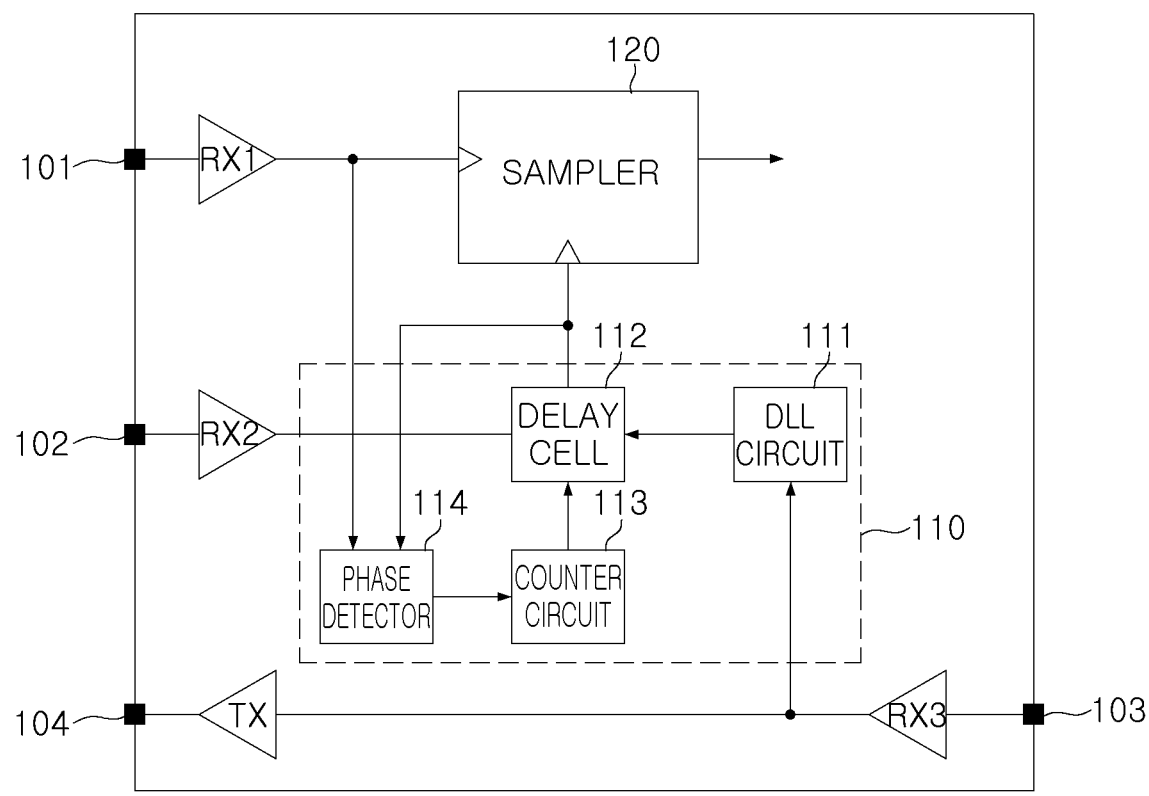
FIGS. 3A, 3B, 4A, and 4B are schematic block diagrams illustrating interface chips according to example embodiments.

Referring to FIG. 3A, an interface chip 100 according to an example embodiment may include a delay circuit 110, a sampler 120, and the like. In addition, the interface chip 100 may be connected to other external devices (e.g., a controller, a host, or the like) through a plurality of pads 101 to 104. In an example embodiment illustrated in FIGS. 3A and 3B, a first receiver RX1 and a second receiver RX2 may receive signals from a memory chip through a first pad 101 and a second pad 102, respectively. Meanwhile, a third receiver RX3 may receive a signal from a controller, a host, or the like, through a third pad 103, and a transmitter TX may transmit a signal to the memory chip through a fourth pad 104.

A controller or a host connected to a memory package including the interface chip 100 may execute a predetermined training operation after power is supplied to the memory package. As an example, the training operation may include ZQ training, duty cycle correction (DCC) training, read training, write training, and the like. In order to execute a DCC training operation for adjusting a duty ratio of a clock signal, the controller or the external host may transmit a read enable signal nRE to the memory package.

The third receiver RX3 of the interface chip 100 may receive the read enable signal through the third pad 103 and transmit the read enable signal to the memory chip through the fourth pad 104. The memory chip receiving the read enable signal may output a first signal and a second signal to the interface chip 100 for the DCC training. For example, the read enable signal may be a square wave signal having a predetermined frequency and duty ratio, and the interface chip 100 may receive the first signal through the first pad 101 and receive the second signal through the second pad 102.

The first receiver RX1 may output a data signal by receiving the first signal from the memory chip to the sampler 120 and the second receiver RX2 may output a raw clock signal by receiving the second signal from the memory chip to the delay circuit 110.

The sampler 120 of the interface chip 100 may sample the data signal at every rising edge and/or falling edge of the raw clock signal and output data. Accordingly, when the rising edge and/or the falling edge of the raw clock signal in the sampler 120 are accurately aligned within one unit interval (UI) of the data signal, the sampler 120 may accurately sample data included in the data signal without an error.

In an example embodiment, the first signal and the second signal output from the memory chip may have the same phase. Accordingly, assuming that there is no skew between the first signal and the second signal, the rising edge and/or the falling edge of the second signal may be aligned within one unit interval of the first signal by applying a delay corresponding to ½ of one unit interval to the second signal. However, even when the interface chip 100 receives the first signal and the second signal having the same phase, skew may occur between the first signal and the second signal within the interface chip 100 due to a difference in transmission paths through which the first signal and the second signal are transmitted respectively within the interface chip 100. Accordingly, when the delay corresponding to ½ of one unit interval is applied to the second signal without considering the skew, the data signal and the raw clock signal may be misaligned with each other in the sampler 120, and resultantly, an error may be included in an output of the sampler 120. As a data rate supported by the interface chip 100 increases, a problem due to misalignment between the data signal and the raw clock signal may occur with a higher probability.

In an example embodiment, in order to solve the problem as described above, the delay circuit 110 may generate a clock signal accurately aligned with the data signal using the raw clock signal. Accordingly, skew between the data signal and the clock signal input to the sampler 120 may be significantly decreased, and the sampler 120 may accurately sample and output data included in the data signal.

The delay circuit 110 may include a delay locked loop (DLL) circuit 111, a delay cell 112, a counter circuit 113, a phase detector 114, and the like. The delay locked loop circuit 111 may output a first delay code for generating an offset delay having a fixed value with reference to the signal received by the third receiver RX3, for example, the read enable signal. The phase detector 114 may detect a phase difference between the data signal and a delay clock signal input to the sampler 120, and the counter circuit 113 may output a second delay code for generating an additional delay corresponding to the phase difference between the data signal and the delay clock signal with reference to an output of the phase detector 114. The delay cell 112 may apply at least one of the offset delay and the additional delay to the raw clock signal to output the delay clock signal to the sampler 120.

When the DCC training operation is started by the controller, the host, or the like, the delay locked loop circuit 111 may output the first delay code corresponding to the offset delay with reference to the read enable signal. As an example, the read enable signal may be a square wave signal having a predetermined period and duty ratio, and a period of the read enable signal may be the same as that of the data signal. The offset delay may correspond to ½ of the unit interval of the data signal.

The delay cell 112 may apply the offset delay to the raw clock signal and input the raw clock signal to which the offset delay is applied to the sampler 120. The phase detector 114 may detect a phase difference between the data signal input to the sampler 120 and the delay clock signal output from the delay cell 112, and the counter circuit 113 may output the second delay code with reference to the phase difference detected by the phase detector 114. The delay cell 112 may apply the additional delay determined by the second delay code to the raw clock signal.

Unlike the offset delay having a fixed value corresponding to ½ of one unit interval of the data signal, the additional delay may vary depending on the phase difference between the data signal input to the sampler 120 and the delay clock signal input to the sampler 120. As an example, the counter circuit 113 and the phase detector 114 may determine the additional delay so that the delay clock signal to which both the offset delay and the additional delay are applied has a phase difference corresponding to one unit interval from the data signal.

When the additional delay is determined so that the data signal and the delay clock signal have a phase difference corresponding to the unit interval of the data signal therebetween, the delay cell 112 may output a clock signal obtained by removing the offset delay from the delay clock signal to the sampler 120. As an example, the delay locked loop circuit 111 may stop outputting the first delay code, or the delay cell 112 may ignore the first delay code. Since the offset delay corresponding to ½ of the unit interval is removed at the phase difference corresponding to one unit interval from the data signal, the rising edge and/or the falling edge of the clock signal output from the delay cell 112 may be accurately aligned within the unit interval of the data signal.

Figure 3B:
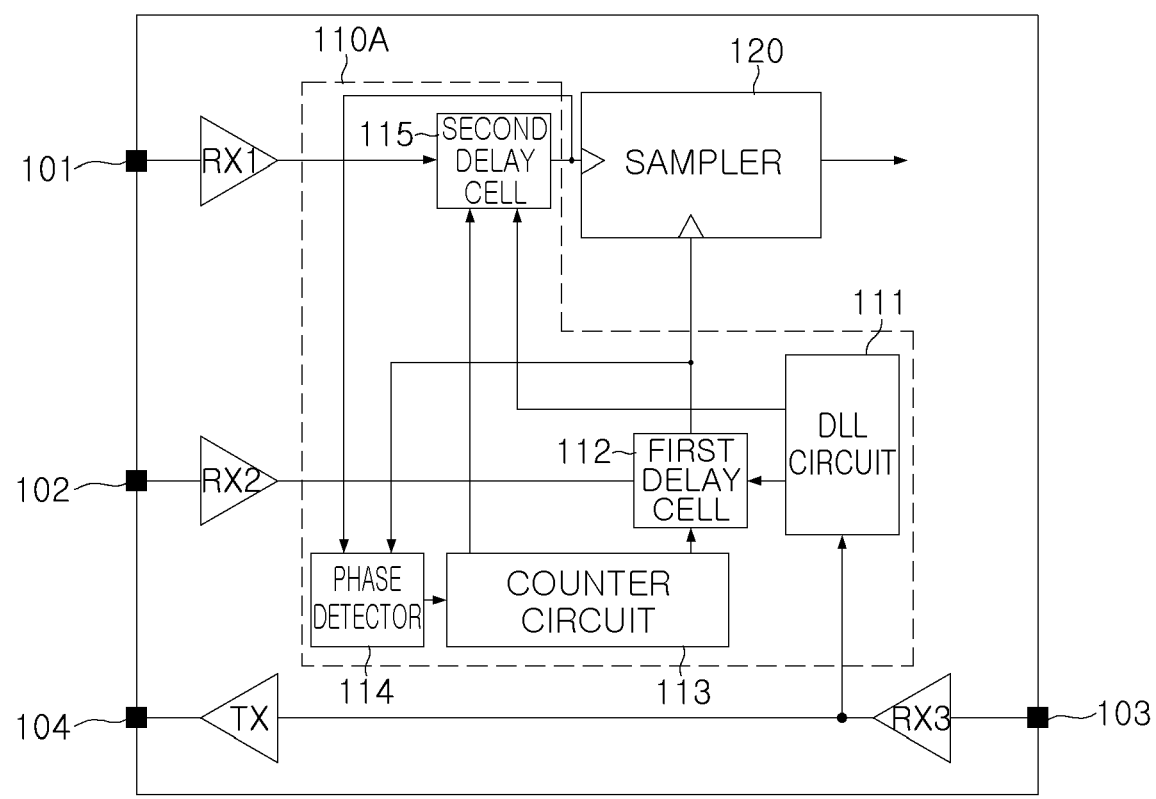

Referring to FIG. 3B, an interface chip 100A according to an example embodiment may include a delay circuit 110A, a sampler 120, and the like. The delay circuit 110A may further include a second delay cell 115. Referring to FIG. 3B, a first delay cell 112 may output a delay clock signal and adjust a phase of the delay clock signal input to the sampler 120, and the second delay cell 115 may output a delay data signal and adjust a phase of the delay data signal input to the sampler 120. As an example, the delay circuit 110A may operate similarly to a vernier-type circuit.

For example, the delay circuit 110A may adjust both a delay code output from the counter circuit 113 to the first delay cell 112 and a delay code output from the counter circuit 113 to the second delay cell 115 to adjust a phase difference between the delay data signal and the delay clock signal input to the sampler 120. As an example, when a minimum delay adjustable in the first delay cell 112 is A and a minimum delay adjustable in the second delay cell 115 is B different from A, the counter circuit 113 may adjust the phase difference between the delay data signal and the delay clock signal input to the sampler 120 by a difference between A and B by individually adjusting the delay codes each output to the first delay cell 112 and the second delay cell 115.

As described above with reference to FIG. 3A, the delay circuit 110A may adjust the phase of the delay clock signal input to the sampler 120 and also adjust the phase of the delay data signal input to the sampler 120 to accurately align the phases of the delay data signal and the delay clock signal in the sampler 120.

As an example, a phase difference between the first signal input to the first pad 101 and the second signal input to the second pad 102 may change depending on a phase difference basically existing between the first signal and the second signal output from the memory chip and a difference between a delay amount existing between the first pad 101 and the second delay cell 115 and a delay amount existing between the second pad 102 and the first delay cell 112 within the interface chip 100A. Depending on the phase difference between the data signal and the raw clock signal, a phase difference between a first delay clock signal obtained by applying an offset delay to the raw clock signal and the data signal may become greater than one unit interval (1UI).

In the case as described above, in the first delay cell 112, in order for a second delay clock signal obtained by applying both the offset delay and the additional delay to the raw clock signal to have a phase difference of 1UI from the data signal, the additional delay needs to be generated as a negative delay. In an example embodiment illustrated in FIG. 3B, in this case, the second delay cell 115 may reflect a predetermined delay in the data signal to decrease the phase difference between the data signal and the raw clock signal. When the second delay cell 115 reflects the predetermined delay in the data signal, an operation for determining the additional delay may be started again. As an example, a phase difference existing in an output of the memory chip, a delay amount difference due to a mismatch between signal paths in the interface chip 100A, and the like, may be applied as default delays. Each of the default delay reflected in the data signal and the default delay reflected in the raw clock signal does not have a fixed value and may change depending on the memory chip, the interface chip 100A, and the like.

Figure 4A:
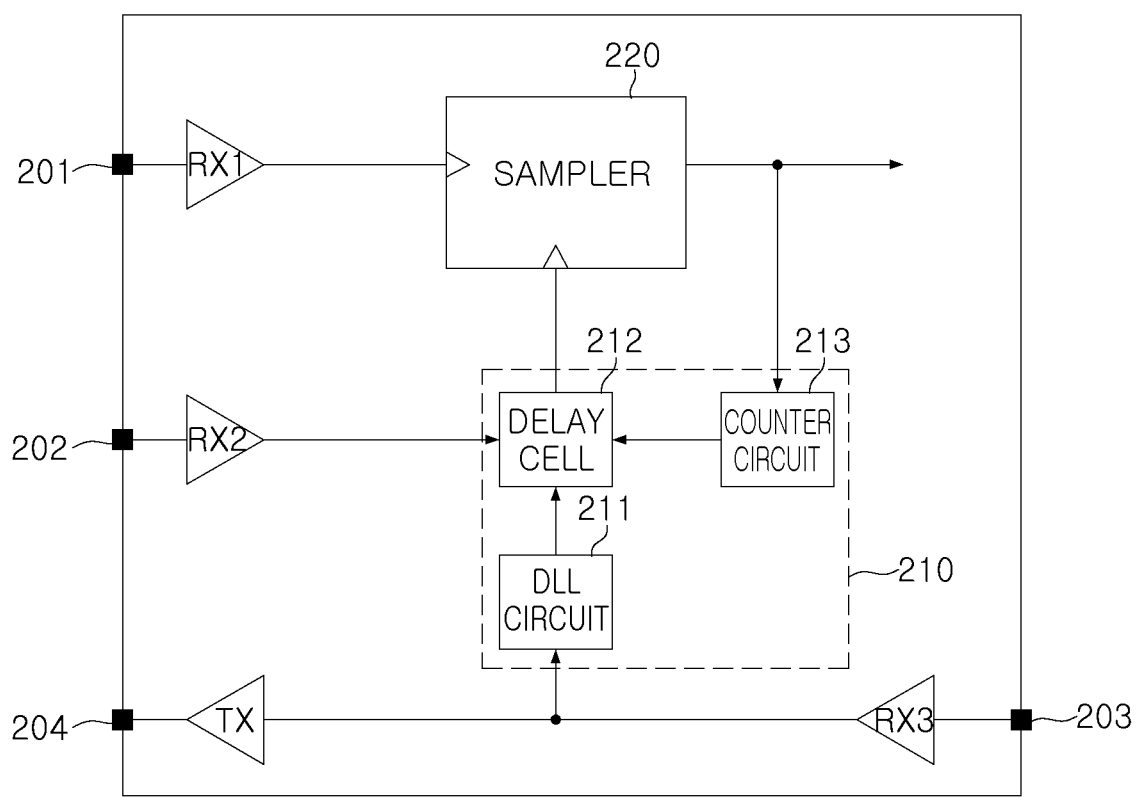

Referring to FIG. 4A, an interface chip 200 according to an example embodiment may include a delay circuit 210, a sampler 220, and the like. In addition, configurations of a plurality of pads 201 to 204 and first to third receivers RX1 to RX3 and a transmitter TX included in the interface chip 200 may be similar to those of the example embodiment described above with reference to FIGS. 3A and 3B.

In an example embodiment illustrated in FIG. 4A, a delay circuit 210 may include a delay locked loop circuit 211, a delay cell 212, and a counter circuit 213. The delay locked loop circuit 211 may output a first delay code with reference to a square wave signal input to a third pad 203, for example, a read enable signal. The delay cell 212 may generate an offset delay corresponding to ½ of a unit interval of a data signal with reference to the first delay code, and output a delay clock signal obtained by applying the offset delay to a raw clock signal received from a second pad 202.

The counter circuit 213 may detect an output of the sampler 220. The data signal may be a toggle signal repeatedly transitioning between a low level and a high level. Accordingly, depending on a phase difference between the data signal and the delay clock signal input to the sampler 220, a dithering phenomenon in which the output of the sampler 220 is not stabilized to one level may occur. In an example embodiment illustrated in FIG. 4A, it may be decided that phases of the data signal and the delay clock signal are matched to each other at a point in time when the output of the sampler 220 dithers.

The counter circuit 213 may output a second delay code, and the delay cell 212 may apply an additional delay to the raw clock signal with reference to the second delay code. The phase difference between the data signal and the delay clock signal in the sampler 220 may change by the additional delay determined according to the second delay code. The delay circuit 210 may select the additional delay under the condition that dithering occurs in a signal output from the sampler 220. A delay clock signal obtained by applying the selected additional delay to the raw clock signal along with the offset delay may have a phase difference corresponding to one unit interval of the data signal from the data signal.

The delay circuit 210 may output a clock signal obtained by excluding the offset delay and applying only the selected additional delay to the raw clock signal to the sampler 220. By removing the offset delay corresponding to ½ of the unit interval and applying only the selected additional delay to the raw clock signal, a rising edge and/or a falling edge of the clock signal may be accurately aligned within the unit interval of the data signal in the sampler 220.

Figure 4B:
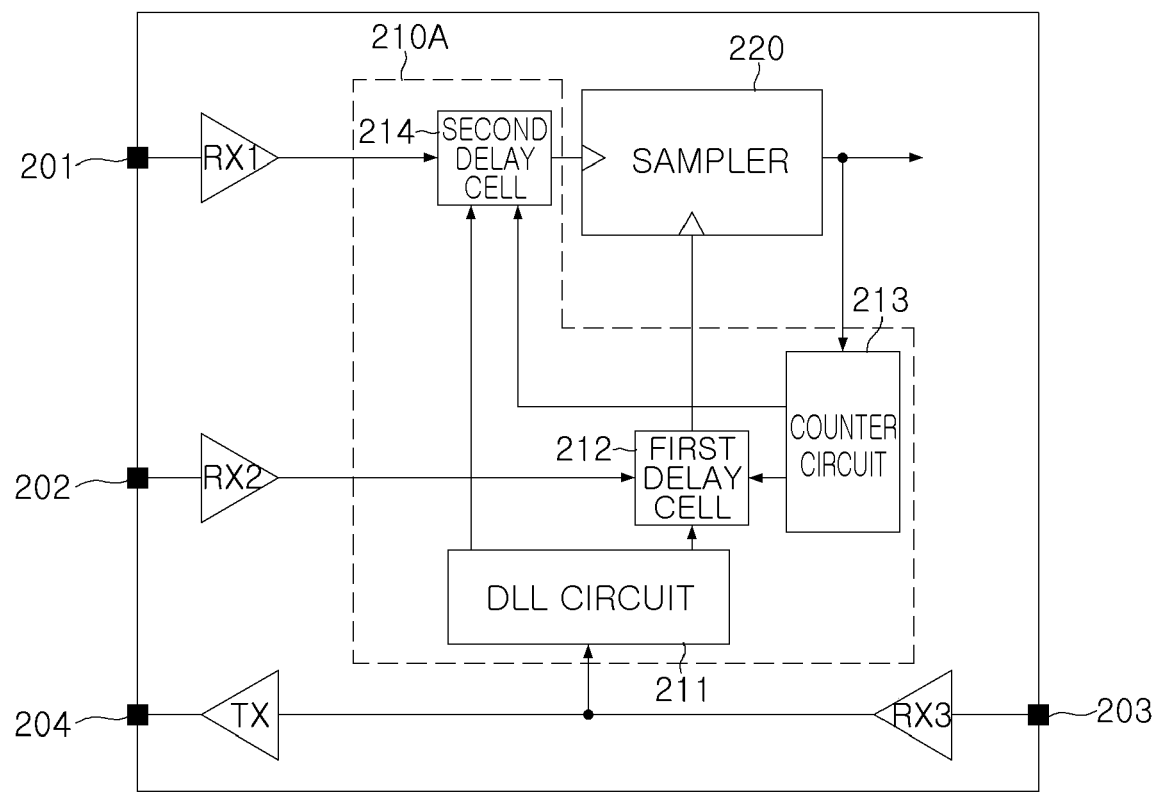

Referring to FIG. 4B, an interface chip 200A according to an example embodiment may include a delay circuit 210A, a sampler 220, and the like. The delay circuit 210A may further include a second delay cell 214. Referring to FIG. 4B, a first delay cell 212 may output a delay clock signal and adjust a phase of the delay clock signal input to the sampler 220, and the second delay cell 214 may output a delay data signal and adjust a phase of the delay data signal input to the sampler 220.

As described above, a phase difference between the first signal input to a first pad 201 and the second signal input to the second pad 202 may change depending on a phase difference existing in an output of the memory chip, a difference between a delay amount existing between the first pad 201 and the second delay cell 214 and a delay amount existing between the second pad 202 and the first delay cell 212, and the like. As an example, depending on the phase difference between the data signal and the raw clock signal, a phase difference between a first delay clock signal obtained by applying an offset delay to the raw clock signal and the data signal may become greater than 1UI.

Similar to the example embodiment described above with reference to FIG. 3B, the second delay cell 214 may reflect a predetermined delay in the data signal to decrease the phase difference between the data signal and the raw clock signal input to the delay circuit 210A. After the second delay cell 214 reflects the predetermined delay in the data signal, an operation for determining the additional delay may be started again.

In an example embodiment illustrated in FIG. 4B, the delay circuit 210A may operate like a vernier-type circuit. As an example, in the delay circuit 210A, the counter circuit 213 may individually adjust the delay codes each input to the first delay cell 212 and the second delay cell 214. Accordingly, the phase difference between the data signal and the clock signal input to the sampler 220 may be finely adjusted by a difference between a minimum delay adjustable by the first delay cell 212 and a minimum delay adjustable by the second delay cell 214, and the phases of the data signal and the clock signal may be matched to each other.

According to an example embodiment, the memory chip may be directly connected to an external host or controller without the interface chips 100 and 200. In this case, as described above with reference to FIGS. 3A, 3B, 4A, and 4B, an operation of aligning the phases of the data signal and the clock signal with each other may be performed in the host or the controller. As an example, the data signal and the raw clock signal may be input to the sampler in the controller by a training command transmitted from the controller to the memory chip. The controller may include the delay circuit, and the delay circuit may apply the offset delay corresponding to ½ of the unit interval of the data signal and the additional delay to the raw clock signal.

As described above, a length of the additional delay may be determined so that the delay clock signal to which the additional delay and the offset delay are applied has the phase difference corresponding to the unit interval of the data signal from the data signal. When the additional delay is determined, the delay circuit in the controller may accurately position the rising edge and/or the falling edge of the clock signal within the unit interval of the data signal by inputting the clock signal obtained by removing the offset delay from the delay clock signal to the sampler.

Figure 5:
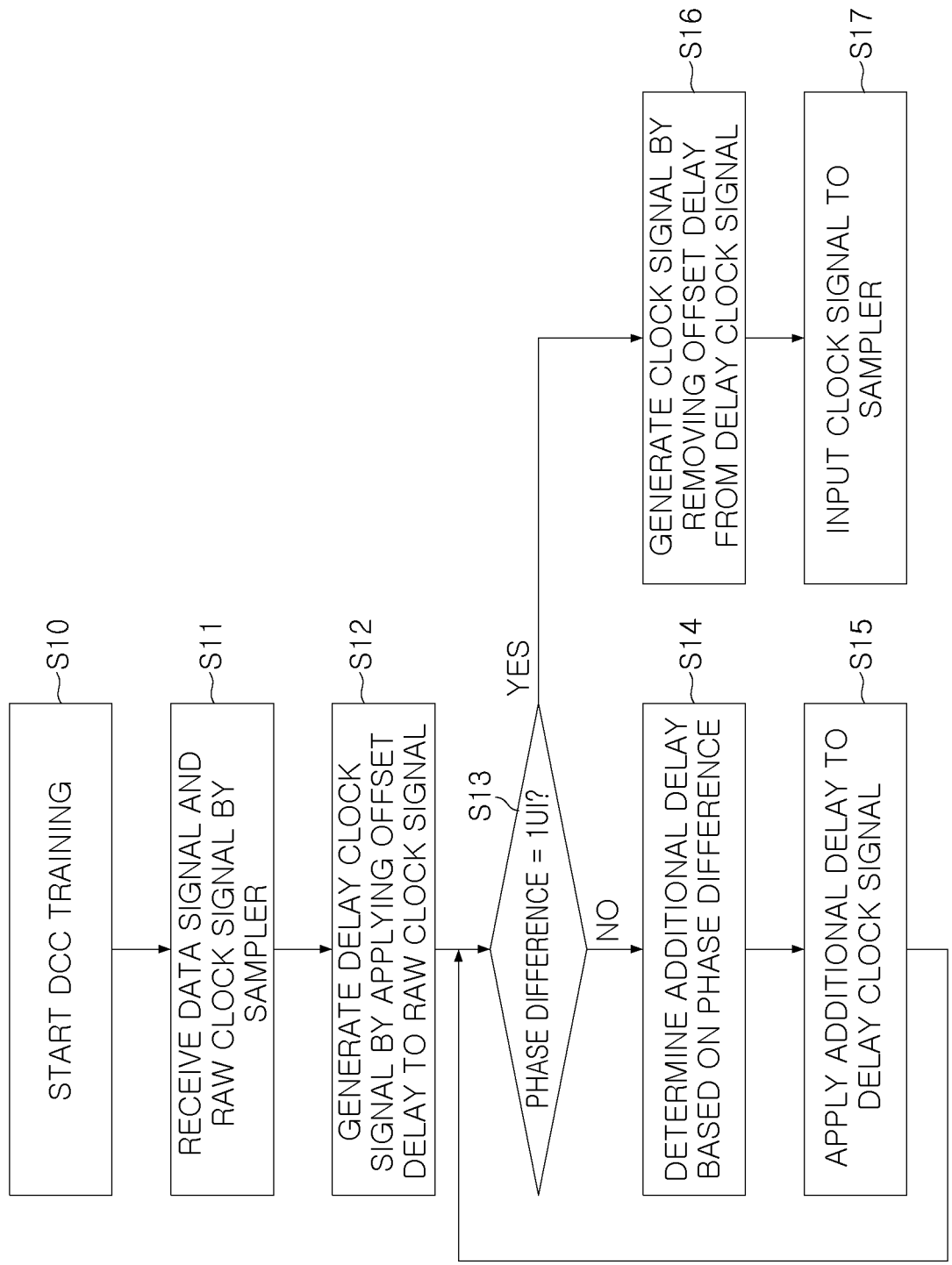
FIGS. 5 and 6 are flowcharts provided to describe operations of a memory system according to example embodiments.
Figure 6:
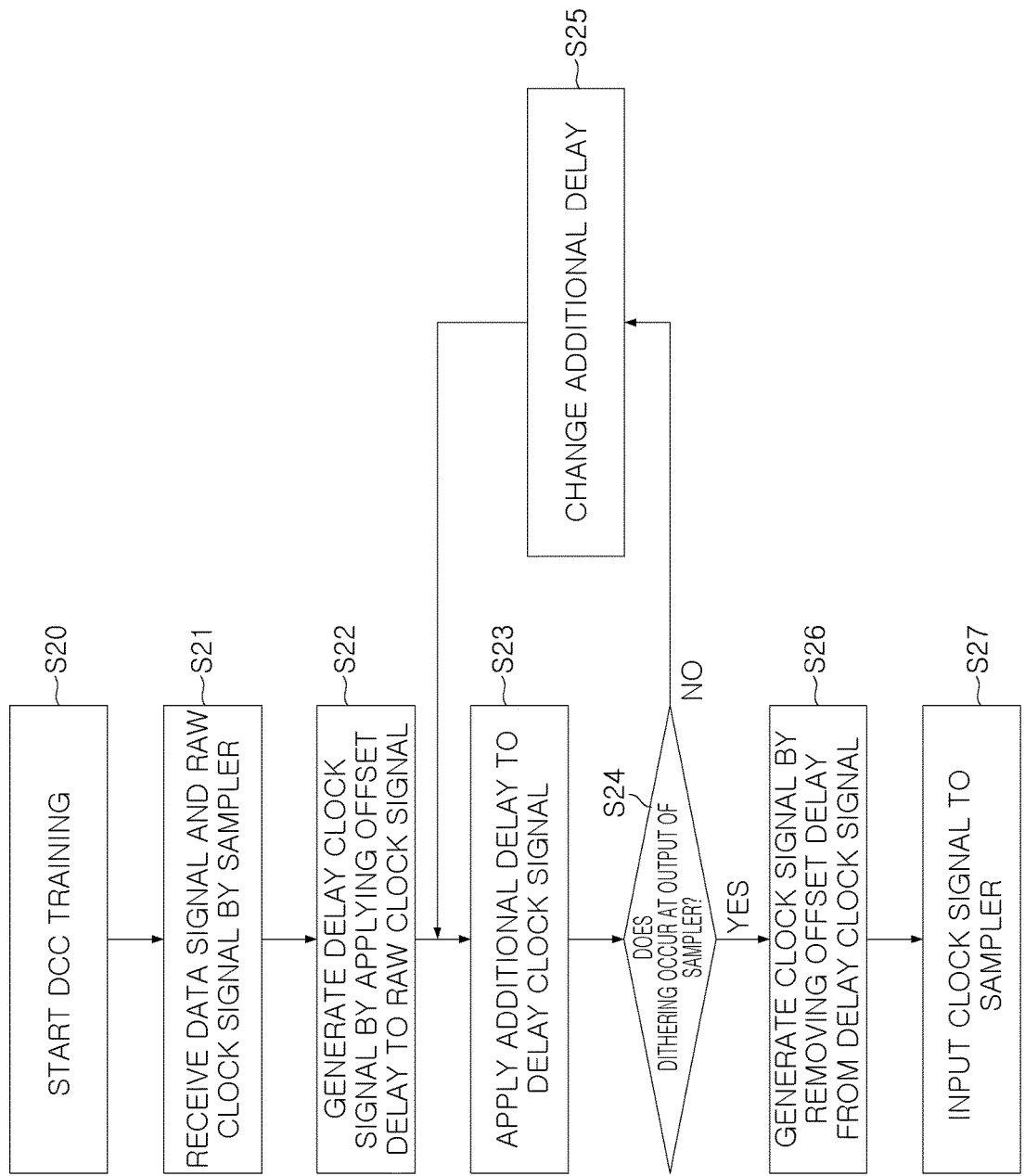

FIGS. 5 and 6 are flowcharts provided to describe operations of a memory system according to example embodiments.

FIG. 5 may be a flowchart illustrating operations of a memory package including the interface chip according to an example embodiment illustrated in FIGS. 3A and 3B. Referring to FIGS. 3A, 3B, and 5 together, the controller or the host connected to the memory package according to an example embodiment may start DCC training (S10). The DCC training is training for determining a duty ratio of a clock signal, and may be executed between ZQ training and read training in an example embodiment.

When the DCC training is started, the interface chip 100 or 100A may execute an operation for removing the skew between the data signal and the clock signal input to the sampler 120, separately from the DCC training. The controller or the external host may not know whether or not the interface chip 100 or 100A is included in the memory package, and the interface chip 100 or 100A may accurately align the data signal and the clock signal with each other in the sampler 120 without a separate training time by executing the operation for removing the skew between the data signal and the clock signal received from the memory chip during the DCC training. According to an example embodiment, when the operation of removing the skew between the data signal and the clock signal is not completed during the DCC training operation, the interface chip 100 or 100A may complete the operation of removing the skew between the data signal and the clock signal during execution of the read training after the DCC training.

The sampler 120 of the interface chip 100 or 100A may receive a first signal and a second signal from at least one of the memory chips (S11). In operation S11, the first signal and the second signal output from the memory chip may have the same phase. However, skew may occur between the data signal input and the raw clock signal input to the sampler 120 due to a delay occurring in the interface chip 100 or 100A.

The delay circuit 110 or 110A may generate the delay clock signal by applying the offset delay to the raw clock signal (S12). The offset delay is a delay determined by the delay locked loop circuit 111 included in the delay circuit 110 or 110A, and may correspond to a time of ½ of one unit interval of the data signal as an example. As an example, the delay locked loop circuit 111 of the delay circuit 110 or 110A may generate the offset delay using the read enable signal received from the controller or the host during the execution of the DCC training, and apply the offset delay to the raw clock signal to generate the delay clock signal.

When the delay clock signal is generated, the delay circuit 110 or 110A may decide whether or not a phase difference between the data signal or the delay data signal and the delay clock signal is equal to one unit interval of the data signal (S13). When the phase difference between the data signal or the delay data signal and the delay clock signal is different from one unit interval of the data signal as a decision result in S13, the additional delay may be determined based on the phase difference between the data signal or the delay data signal and the delay clock signal detected by the phase detector 114 (S14). As an example, the additional delay may be a delay to be additionally applied to the delay clock signal in order to allow the phase difference between the data signal or the delay data signal and the delay clock signal to coincide with one unit interval of the data signal. The counter circuit 113 of the delay circuit 110 or 110A may output the delay code corresponding to the additional delay to the delay cell 112, and the delay cell 112 may apply the additional delay to the delay clock signal (S15).

While the delay clock signal to which the offset delay and the additional delay are applied is input to the sampler 120, the delay circuit 110 or 110A may decide again whether or not the phase difference between the data signal or the delay data signal and the delay clock signal is equal to one unit interval of the data signal (S13). When the phase difference between the data signal or the delay data signal and the delay clock signal is still different from one unit interval of the data signal as a decision result in S13, the additional delay may be determined again (S14), and may be applied to the delay clock signal (S15).

On the other hand, when the phase difference between the data signal or the delay data signal and the delay clock signal is equal to one unit interval of the data signal as a decision result of S13, the delay circuit 110 may generate the clock signal by removing the offset delay from the delay clock signal input to the sampler 120 (S16). The clock signal generated in S16 may be a signal obtained by applying a delay existing in the interface chip 100 or 100A and the additional delay generated by the delay cell 112 to the raw clock signal.

The clock signal is generated by removing the offset delay from the delay clock signal under the condition that the phase difference between the delay clock signal or the delay data signal and the data signal is one unit interval of the data signal, and thus, the data signal or the delay data signal and the clock signal may have a phase difference corresponding to ½ of one unit interval of the data signal therebetween. Accordingly, the rising edge and/or the falling edge of the clock signal may be accurately aligned within one unit interval of the data signal, and the skew between the data signal or the delay data signal and the clock signal may be effectively removed. The clock signal may be input to the sampler 120 (S17), and the sampler 120 may sample data included in the data signal in synchronization with the clock signal.

FIG. 6 may be a flowchart illustrating operations of a memory package including the interface chip according to an example embodiment illustrated in FIGS. 4A and 4B. Referring to FIGS. 4A, 4B, and 6 together, the controller or the host connected to the memory package according to an example embodiment may start DCC training (S20). When the DCC training is started, the interface chip 200 or 200A may execute an operation for removing the skew between the data signal and the clock signal input to the sampler 220.

The sampler 220 of the interface chip 200 or 200A may receive a data signal and a raw clock signal from at least one of the memory chips included in the memory package (S21). In operation S21, the data signal and the raw clock signal output from the memory chip may have the same phase. Skew may occur between the data signal and the raw clock signal input to the sampler 220 due to a delay existing in the interface chip 200 or 200A.

The delay circuit 210 or 210A may generate the delay clock signal by applying the offset delay to the raw clock signal (S22). Similar to that described above with reference to FIG. 5, the offset delay is a fixed delay and may correspond to a time of ½ of one unit interval of the data signal.

The delay circuit 210 or 210A may apply the additional delay to the delay clock signal (S23), and the sampler 220 may sample the data signal in synchronization with the delay clock signal output from the delay circuit 210 or 210A. The delay circuit 210 or 210A may detect an output of the sampler 220. As an example, the counter circuit 213 may decide whether or not dithering occurs in the output of the sampler 220 after the additional delay is applied to the delay clock signal (S24), and may determine whether or not to change the delay code for determining the additional delay according to a decision result.

When the dithering does not occur in the output of the sampler 220 after the additional delay is applied, the counter circuit 213 may change the delay code and output the changed delay code to the delay cell 212. As an example, the delay cell 212 may increase the additional delay applied to the delay clock signal in response to the delay code changed by the counter circuit 213 (S25). The delay cell 212 may apply the changed additional delay to the delay clock signal (S23), and decide again whether or not dithering occurs in the output of the sampler 220 (S24).

When the dithering is detected in the output of the sampler as a decision result in operation S24, the delay circuit 210 may decide that the delay clock signal to which the additional delay is applied has a phase difference corresponding to one unit interval from the data signal. Accordingly, the delay circuit 210 or 210A may generate the clock signal by removing the offset delay from the delay clock signal (S26), and may input the clock signal to the sampler (S27).

As described with reference to FIG. 5, the offset delay is removed from the delay clock signal under the condition that the delay clock signal to which the additional delay and the offset delay are applied has the phase difference corresponding to one unit interval of the data signal from the data signal, and thus, the data signal and the clock signal may have a phase difference corresponding to ½ of one unit interval of the data signal therebetween. Accordingly, the rising edge and/or the falling edge of the clock signal may be accurately aligned within the unit interval of the data signal, and the skew between the data signal and the clock signal may be effectively removed.

Figure 7:
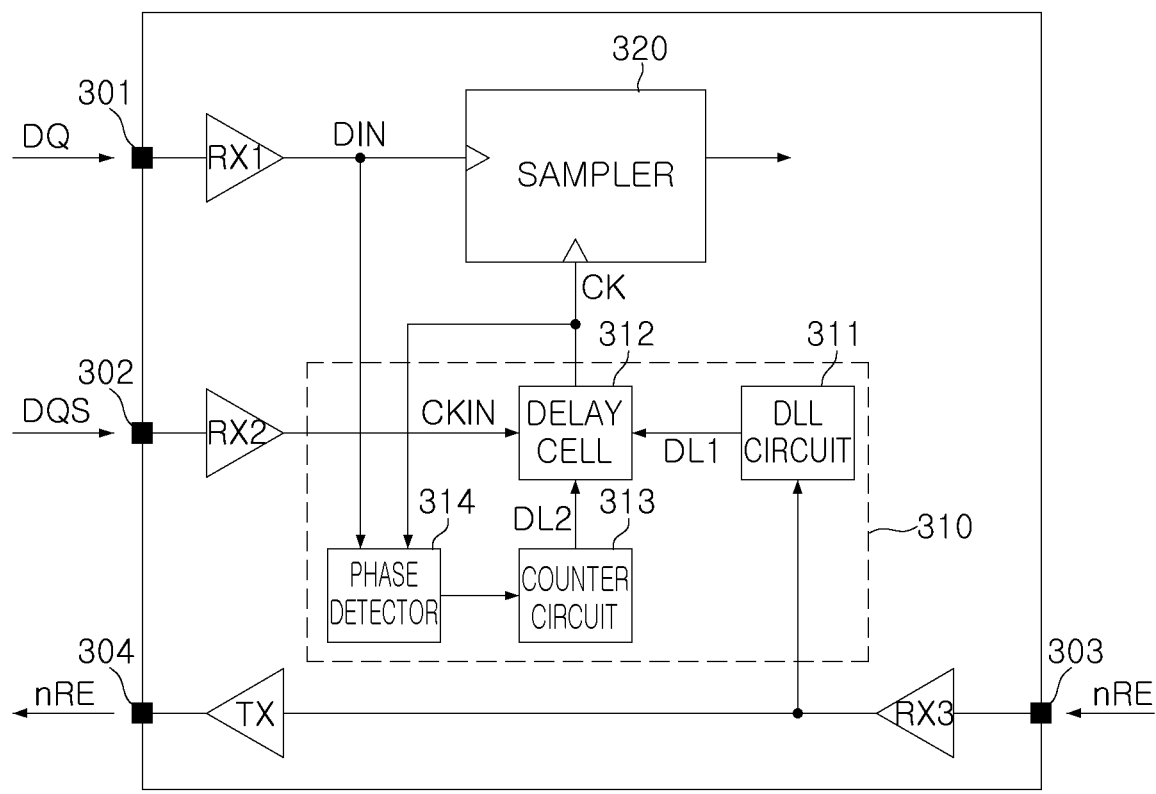
FIG. 7 is a schematic block diagram illustrating an interface chip according to an example embodiment.

FIG. 7 is a schematic block diagram illustrating an interface chip according to an example embodiment.

Referring to FIG. 7, an interface chip 300 may include a delay circuit 310 and a sampler 320. The interface chip 300 may be connected to other external devices (e.g., a controller, a host, or the like) through a plurality of pads 301 to 304, and the plurality of pads 301 to 304 may be connected to first to third receivers RX1 to RX3 and a transmitter TX.

As described above, while a controller or a host connected to a third pad 303 executes a predetermined training operation, the interface chip 300 may remove a phase difference between a data signal DIN and a clock signal CK input to the sampler 320. A DQ signal received by a first receiver RX1 from the memory chip may have a phase different from that of the data signal DIN input to the sampler 320. This may be due to a delay existing in a transmission path between a first pad 301 and the sampler 320 in the interface chip 300. Similarly, due to a delay existing in a transmission path between a second pad 302 and the sampler 320, a DQS signal input to the second pad 302 may have a phase different from that of a raw clock signal CKIN input to the delay circuit 310.

The controller or the host may transmit a predetermined control signal, for example, a read enable signal nRE, to the interface chip 300 in order to execute a training operation. The interface chip 300 may output the read enable signal nRE to the memory chip and receive the DQ signal and the DQS signal.

The delay circuit 310 may generate a first delay DL1 having a fixed value while the training operation is executed with reference to the read enable signal nRE. In addition, the delay circuit 310 may generate a second delay DL2 of which a value changes depending on a condition unlike the first delay DL1. As an example, the second delay DL2 may be determined as a value optimized for removing skew between the data signal DIN and the clock signal CK input to the sampler 320. Operations of an interface chip 300 will hereinafter be described in more detail with reference to FIGS. 8 to 13 together.

FIGS. 8 to 13 are waveform diagrams illustrating operations of an interface chip according to example embodiments.

Figure 8:
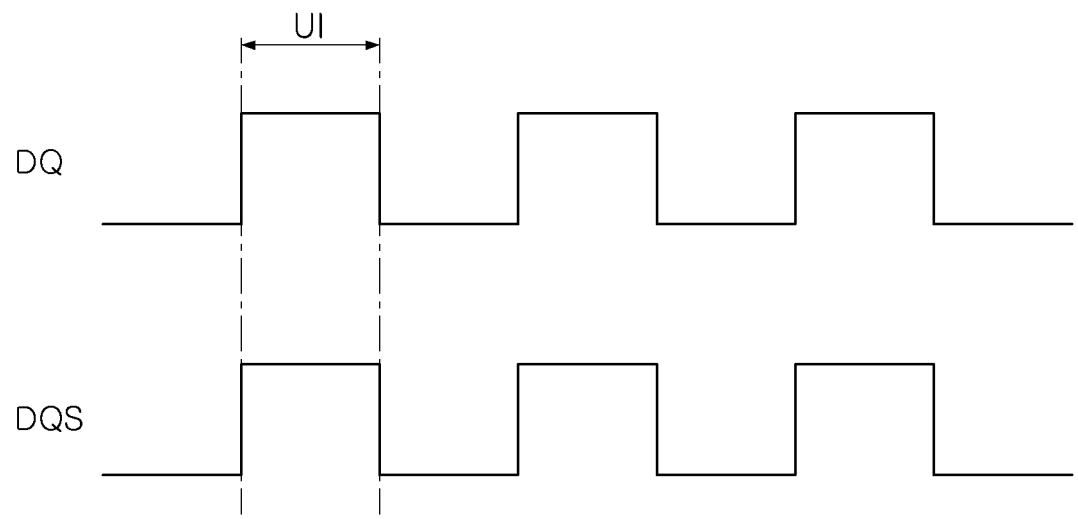
FIGS. 8 to 13 are waveform diagrams illustrating operations of an interface chip according to example embodiments.

Referring to FIG. 8, the DQ signal may be a signal having a predetermined unit interval UI, and the DQS signal may be a signal having the same phase as the DQ signal. In an example embodiment, a duty ratio of the DQS signal may be 50%. The memory chip may generate and output the DQ signal and the DQS signal so as to have the same phase at the first pad 301 and the second pad 302.

Figure 9:
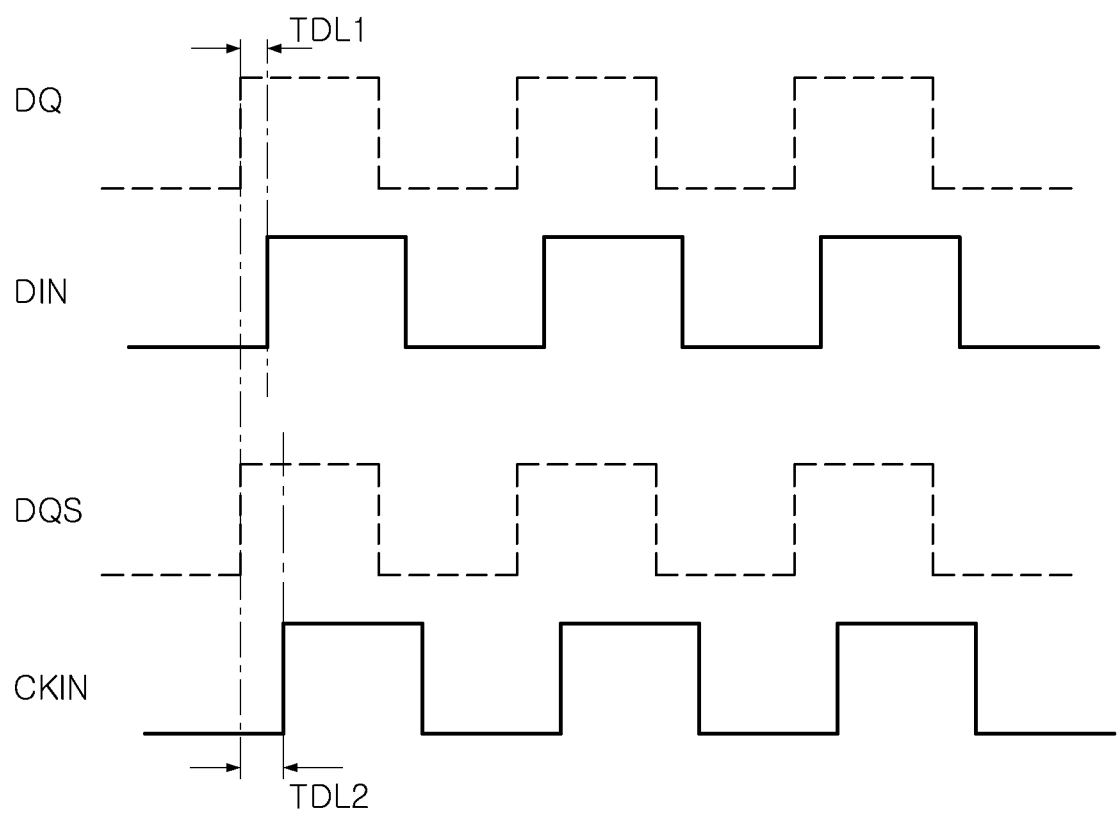

As described above, the delay generated in the transmission path between the first pad 301 and the sampler 320 may be different from the delay generated in the transmission path between the second pad 302 and the sampler 320. Referring to FIG. 9, a first default delay TDL1 existing in the transmission path between the first pad 301 and the sampler 320 may be different from a second default delay TDL2 existing in the transmission path between the second pad 302 and the sampler 320. As described above, each of the first default delay TDL1 and the second default delay TDL2 may change depending on the memory chip outputting the DQ signal and the DQS signal to the interface chip 300 as well as a mismatch existing in transmission paths in the interface chip 300.

In an example embodiment illustrated in FIG. 9, the second default delay TDL2 may be greater than the first default delay TDL1. The data signal DIN input to the sampler 320 may have a phase difference corresponding to the first default delay TDL1 from the DQ signal, and the raw clock signal CKIN input to the delay circuit 310 may have a phase difference corresponding to the second default delay TDL2 from the DQS signal.

Figure 10:
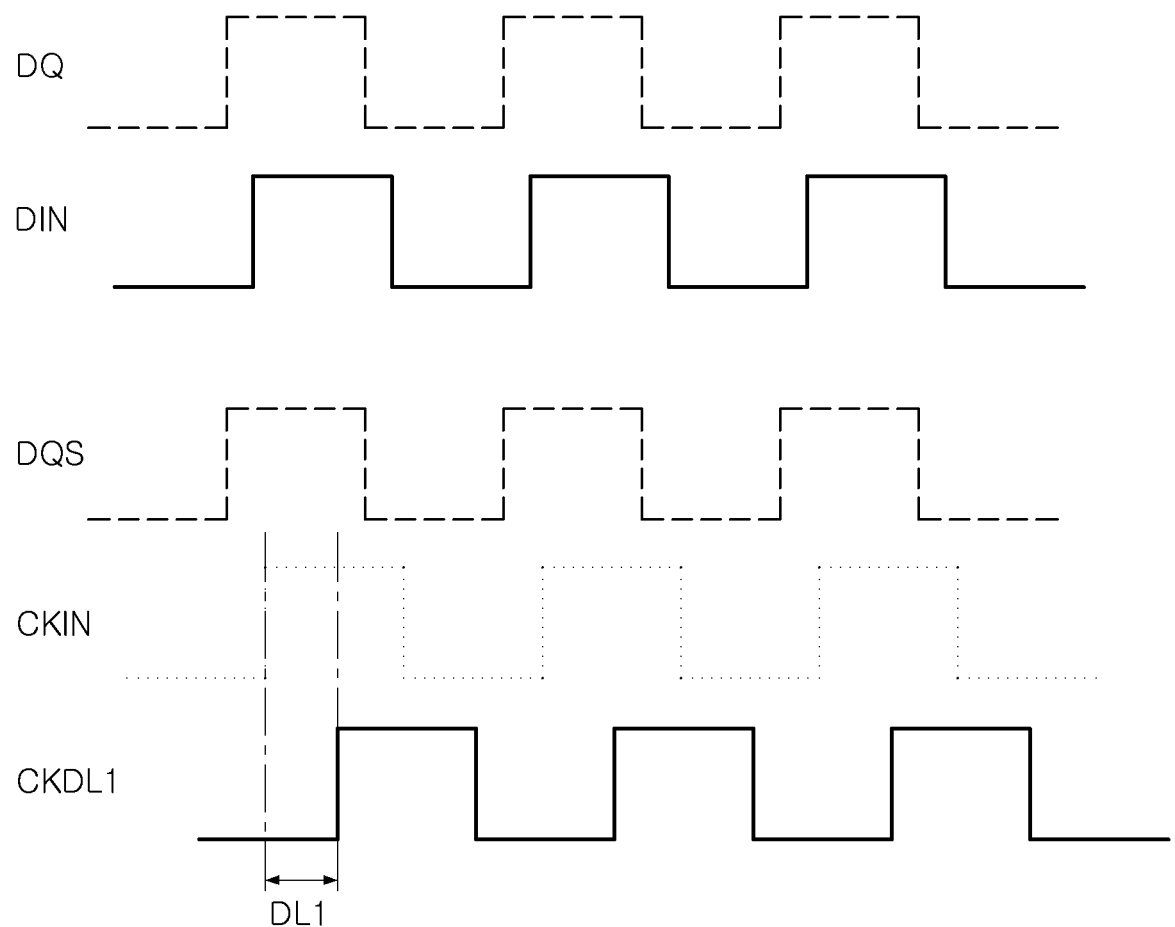

Referring to FIG. 10, the delay circuit 310 may generate a first delay clock signal CKDL1 by applying the first delay DL1 to the raw clock signal CKIN. The first delay DL1 may correspond to ½ of one unit interval UI of the data signal DIN. As an example, a delay locked loop circuit 311 may output a first delay code corresponding to the first delay DL1 to a delay cell 312, and the delay cell 312 may apply the first delay DL1 to the raw clock signal CKIN with reference to the first delay code. Since the first delay DL1 is additionally applied to the raw clock signal CKIN, a phase difference between the data signal DIN and the first delay clock signal CKDL1 may be greater than a phase difference between the data signal DIN and the raw clock signal CKIN.

The sampler 320 may sample the data signal DIN in synchronization with the first delay clock signal CKDL1. A phase detector 314 of the delay circuit 310 may detect the phase difference between the first delay clock signal CKDL1 output from the delay cell 312 and the data signal DIN. A counter circuit 313 may output a second delay code corresponding to the second delay DL2 to the delay cell 312 with reference to the phase difference between the first delay clock signal CKDL1 and the data signal DIN. The delay cell 312 may generate the second delay DL2 with reference to the second delay code, and apply the second delay DL2 to the first delay clock signal CKDL1.

Figure 11:
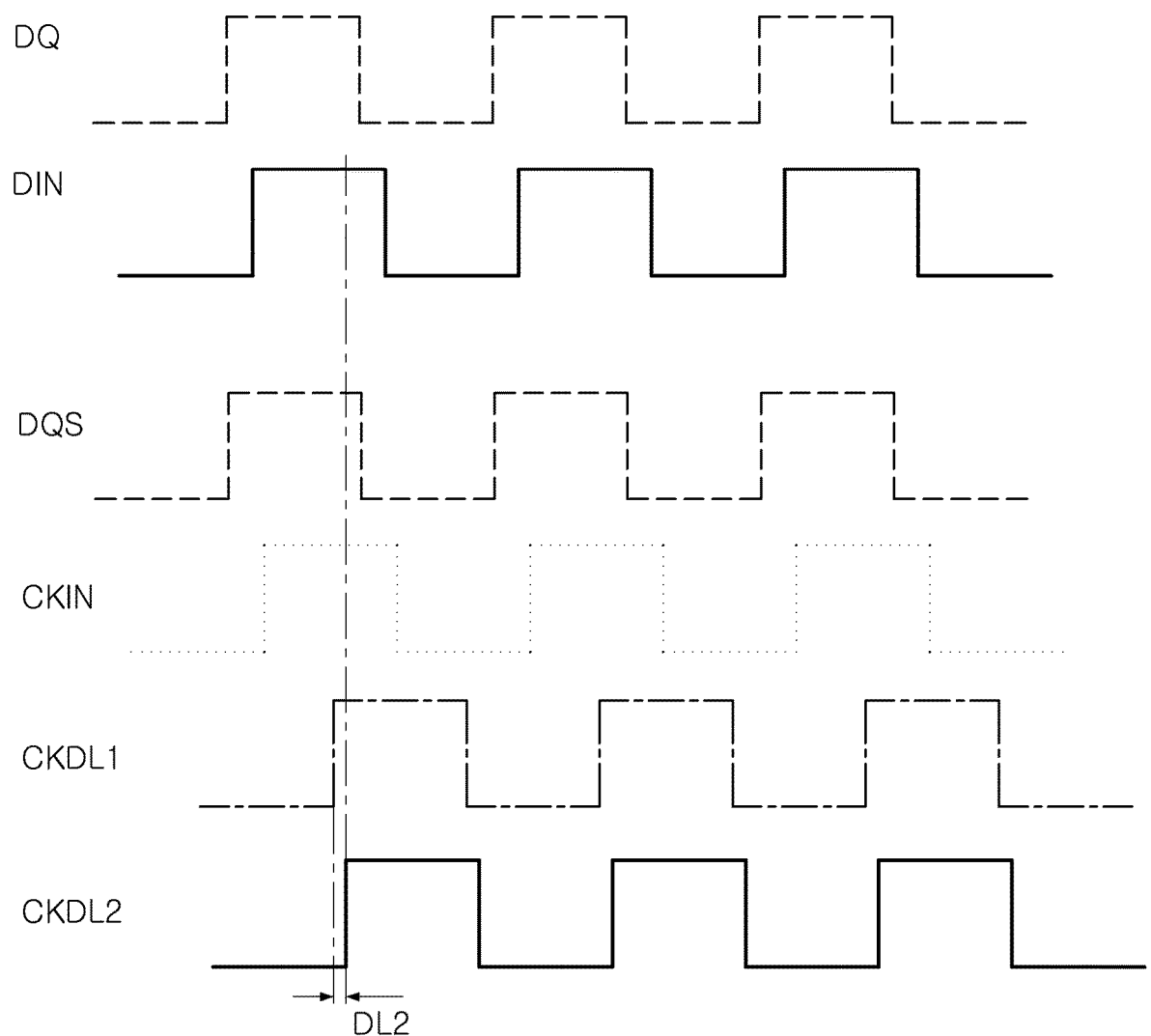

Referring to FIG. 11, the delay cell 312 may generate a second delay clock signal CKDL2 by additionally apply the second delay DL2 to the first delay clock signal CKDL1. While the delay cell 312 outputs the second delay clock signal CKDL2, the phase detector 314 may compare a phase difference between the data signal DIN and the second delay clock signal CKDL2 with the unit interval UI of the data signal DIN. When the phase difference between the data signal DIN and the second delay clock signal CKDL2 is less than one unit interval UI of the data signal DIN, the counter circuit 313 may change the second delay code so that the second delay DL2 is increased, and output the changed second delay code to the delay cell 312.

Figure 12:
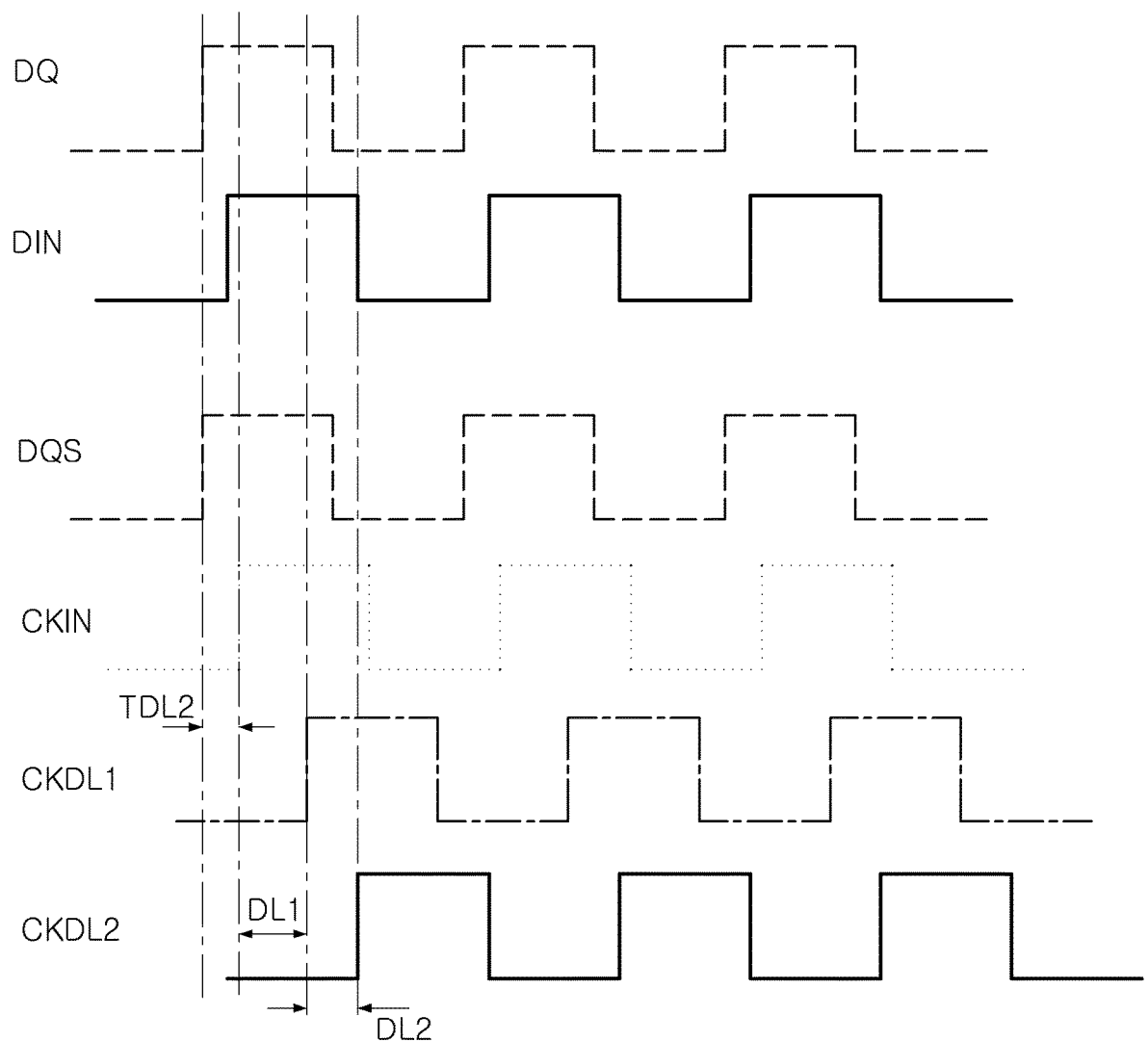

The second delay DL2 may be adjusted until the phase difference between the second delay clock signal CKDL2 and the data signal DIN becomes equal to one unit interval of the data signal DIN, as illustrated in FIG. 12. Referring to FIG. 12, the second delay clock signal CKDL2 obtained by applying the first delay DL1 and the second delay DL2 to the raw clock signal CKIN may have a phase difference corresponding to one unit interval of the data signal DIN from the data signal DIN.

Figure 13:
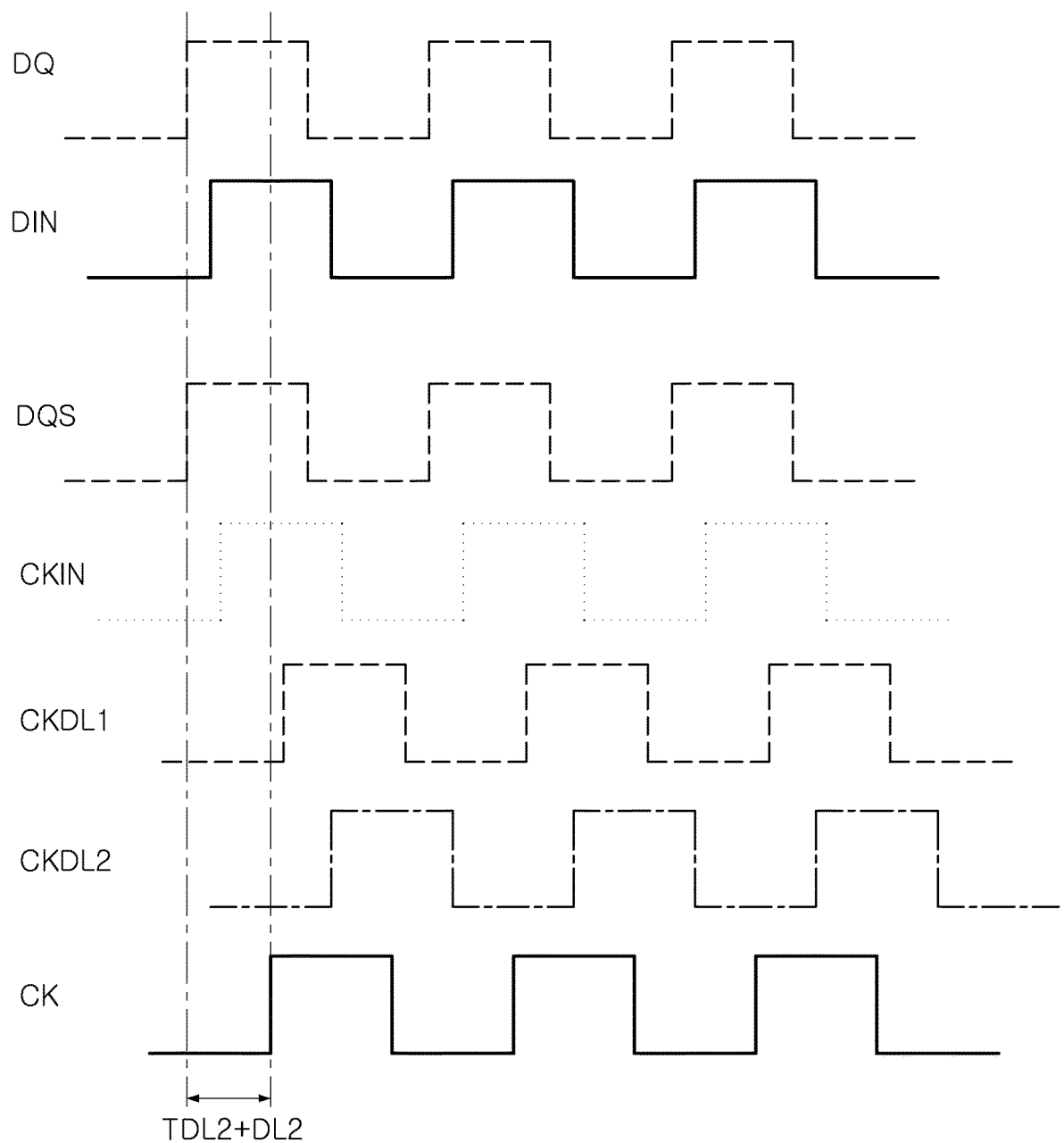

When the second delay DL2 is determined as illustrated in FIG. 12, the delay circuit 310 may output the clock signal CK obtained by removing the first delay DL1 from the second delay clock signal CKDL2 to the sampler 320. Referring to FIG. 13, the delay cell 312 may generate the clock signal CK by removing the first delay DL1 from the second delay clock signal CKDL2. The clock signal CK may have a phase difference corresponding to a delay obtained by adding the second default delay TDL2 and the second delay DL2, from the DQS signal. For example, the clock signal CK may have a phase difference corresponding to a delay obtained by adding a phase difference corresponding to a delay difference between the data signal DIN and the raw clock signal CKIN and the second delay DL2, from the data signal DIN. The phase difference corresponding to the delay difference may correspond to a delay of (TDL2−TDL1). For example, a sum of the delay difference and the second delay DL2 may correspond to ½ of one unit interval UI of the data signal DIN.

Since the first delay DL1 corresponding to a time of ½ of one unit interval of the data signal DIN is removed from the second delay clock signal CKDL2 having the phase difference corresponding to one unit interval of the data signal DIN from the data signal DIN, a rising edge or a falling edge of the clock signal CK may be accurately aligned within one unit interval of the data signal DIN. Accordingly, skew between the data signal DIN and the clock signal CK input to the sampler 320 may be significantly decreased, and reliability of the interface chip 300 may be improved even in a high-speed operation.

FIGS. 14 to 19 are waveform diagrams illustrating operations of an interface chip according to example embodiments.

Figure 14:
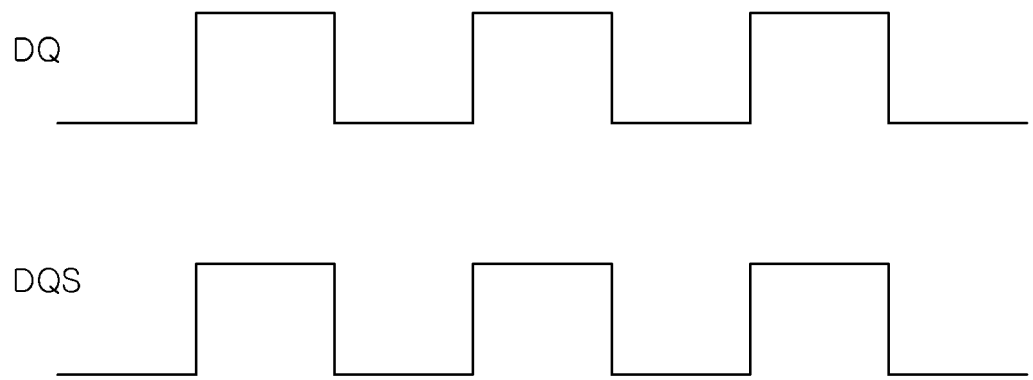
FIGS. 14 to 19 are waveform diagrams illustrating operations of an interface chip according to example embodiments.
Figure 15:
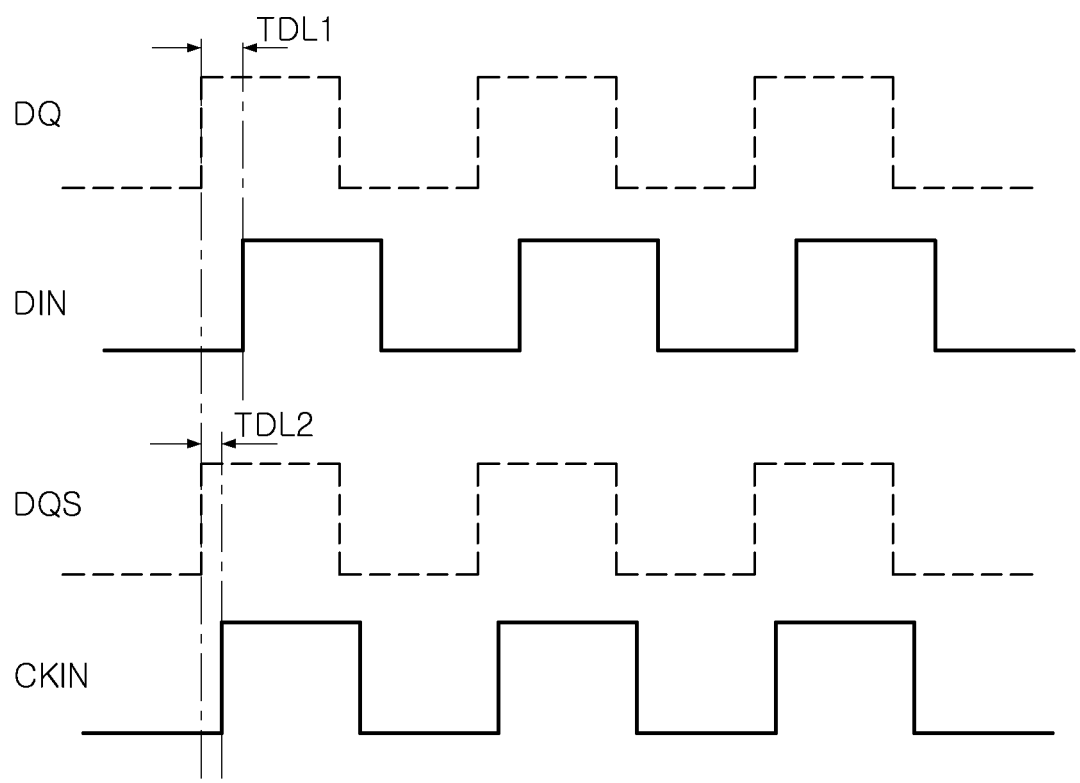

An interface chip according to an example embodiment described with reference to FIGS. 14 to 19 may remove skew between a data signal and a clock signal input to a sampler using an output of the sampler. Referring to FIG. 14, a DQ signal may be a signal having a predetermined unit interval UI, and may be a toggle signal transitioning between a high level and a low level for each unit interval UI. The memory chip may generate and output the DQ signal and a DQS signal so as to have the same phase at the first pad and the second pad.

As described above, the first default delay TDL1 existing in the transmission path between the first pad and the sampler may be different from the second default delay TDL2 existing in the transmission path between the second pad and the sampler. In an example embodiment illustrated in FIG. 15, the first default delay TDL1 may be greater than the second default delay TDL2. As illustrated in FIGS. 9 to 13, when the first default delay TDL1 is shorter than the second default delay TDL2, an operation of updating a code for determining a delay of the clock signal input to the sampler and comparing a phase difference between the data signal and the clock signal input to the sampler may be repeated to match phases of the data signal and the clock signal input to the sampler to each other.

Figure 16:
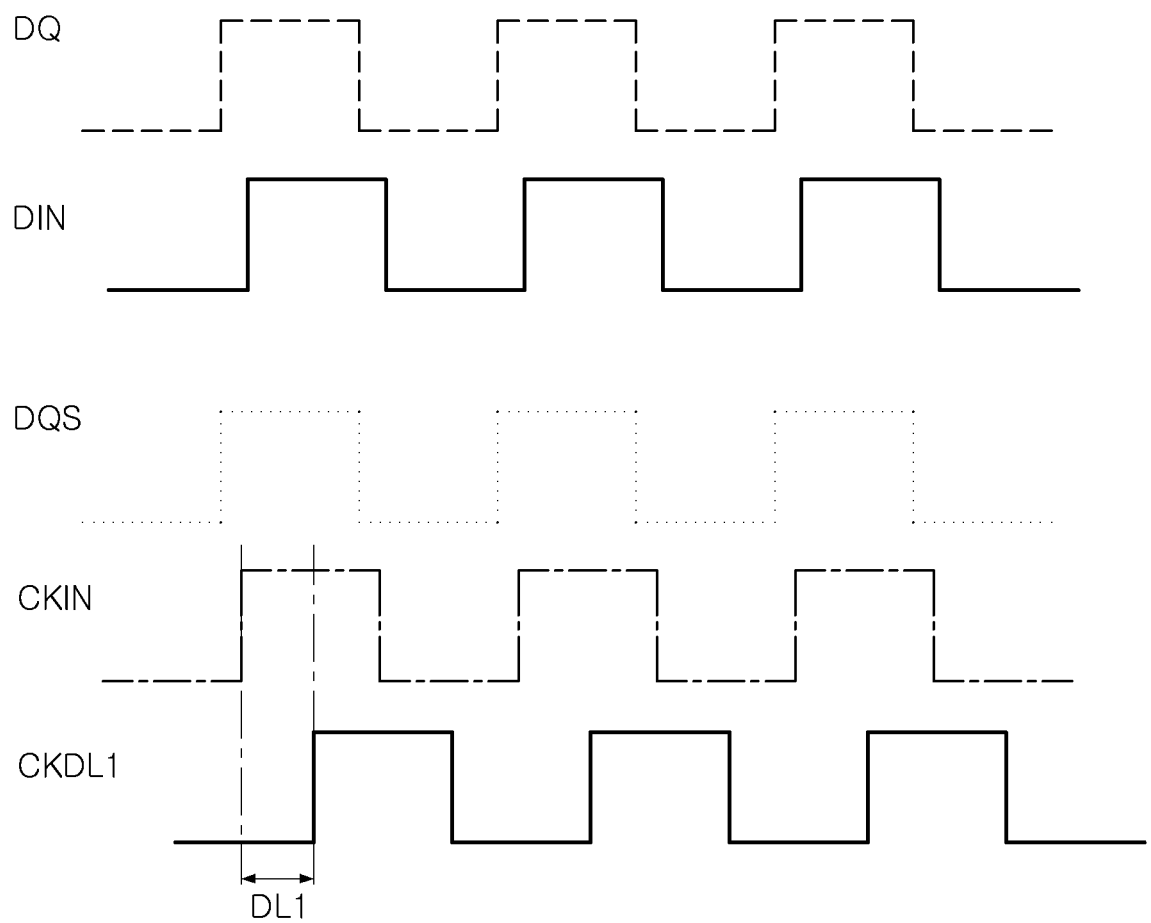

Referring to FIG. 16, the delay circuit may generate a first delay clock signal CKDL1 by applying the first delay DL1 to the raw clock signal CKIN. The first delay DL1 may correspond to ½ of one unit interval UI of the data signal DIN. The delay locked loop circuit may output a first delay code used to generate the first delay DL1 corresponding to ½ of one unit interval UI of the data signal DIN to the delay cell, using the read enable signal nRE.

Figure 17:
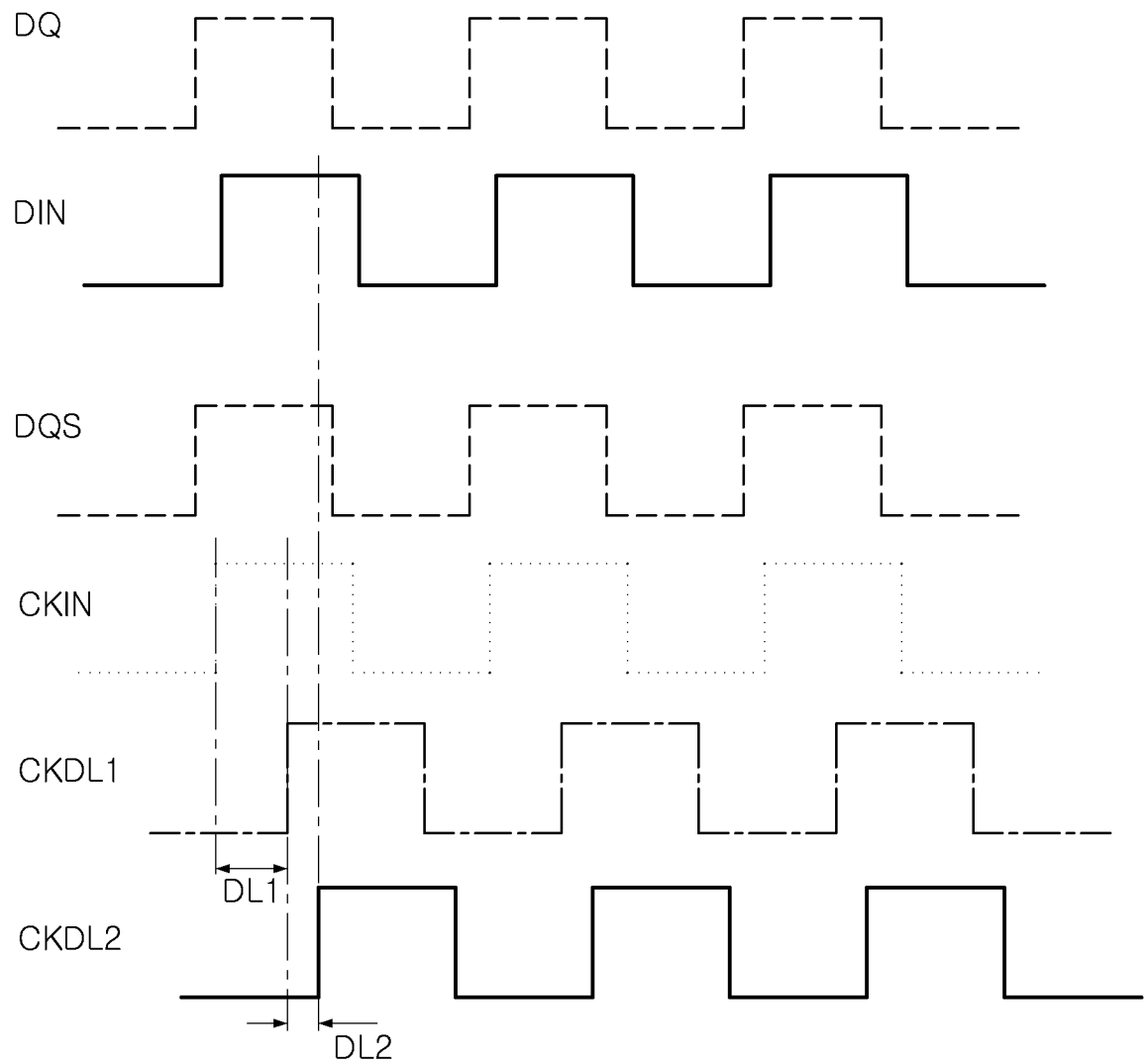

The delay circuit may output a second delay clock signal CKDL2 obtained by applying the second delay DL2 to the first delay clock signal CKDL1 to the sampler, and may detect an output of the sampler while the sampler samples the data signal DIN in synchronization with the second delay clock signal CKDL2. As an example, when the second delay DL2 as illustrated in FIG. 17 is applied to the first delay clock signal CKDL1, the sampler may sample and output the data signal DIN at a rising edge of the second delay clock signal CKDL2.

Figure 18:
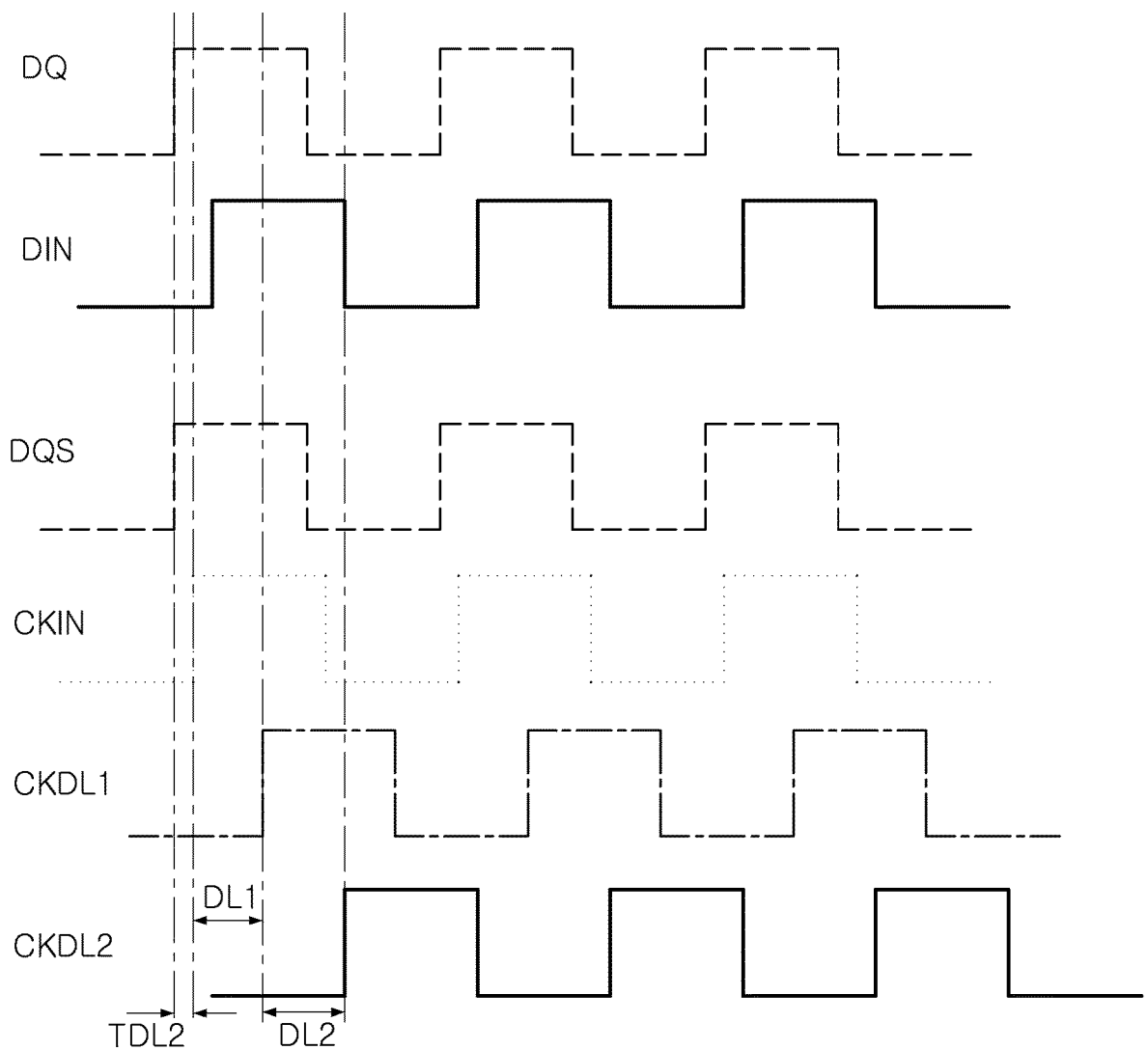

In an example embodiment, the delay circuit may detect the output of the sampler synchronized with the second delay clock signal CKDL2 while gradually increasing the second delay DL2. When the second delay DL2 increases, such that the rising edge of the second delay clock signal CKDL2 is aligned with a falling edge of the data signal DIN as illustrated in FIG. 18, the output of the sampler may change from a high logic value to a low logic value. In such a manner, the delay circuit may determine the second delay DL2 under the condition that the second delay clock signal CKDL2 and the data signal DIN have a phase difference corresponding to one unit interval (1UI) of the data signal DIN therebetween.

As illustrated in FIG. 18, when the second delay clock signal CKDL2 to which the second delay DL2 is additionally applied has a phase difference corresponding to one unit interval 1UI of the data signal DIN from the data signal DIN, the delay circuit may generate the clock signal CK by removing the first delay DL1 from the second delay clock signal CKDL2. The clock signal CK may have a phase difference corresponding to a delay obtained by adding the second default delay TDL2 and the second delay DL2, from the DQS signal. For example, the clock signal CK may have a phase difference corresponding to a delay obtained by adding a phase difference corresponding to a delay difference between the data signal DIN and the raw clock signal CKIN and the second delay DL2, from the data signal DIN. The phase difference corresponding to the delay difference may correspond to a delay of (TDL1−TDL2). For example, a sum of the delay difference and the second delay DL2 may correspond to ½ of one unit interval UI of the data signal DIN.

Figure 19:
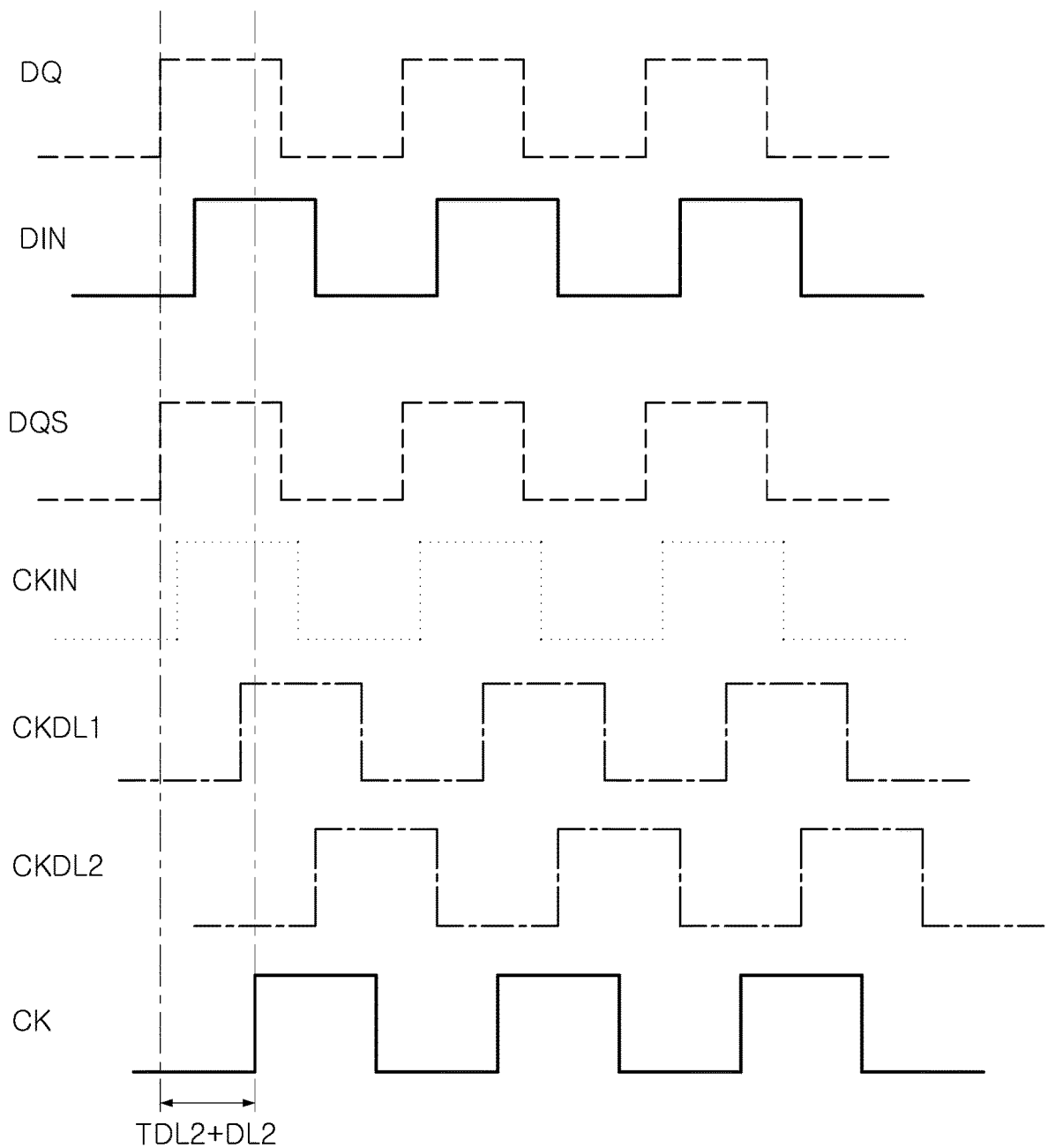

Referring to FIG. 19, since the first delay DL1 corresponding to a time of ½ of one unit interval of the data signal DIN is removed from the second delay clock signal CKDL2 having the phase difference corresponding to one unit interval of the data signal DIN from the data signal DIN, a rising edge or a falling edge of the clock signal CK may be accurately aligned within one unit interval of the data signal DIN. Accordingly, skew between the data signal DIN and the clock signal CK input to the sampler may be significantly decreased, and reliability of the interface chip may be improved even in a high-speed operation.

In some embodiments, a DQSB signal may input to the second pad 302 instead of the DQS signal. In this case, the sampler 320 may receive the data signal DIN and a complementary clock signal CKB. The complementary clock signal CKB may also be generated in a similar manner to the clock signal CK. Herein, the DQS signal and the DQSB signal may have a phase difference of 180° therebetween. In other words, the DQSB signal may be a complementary signal of the DQS signal. Accordingly, skew between the data signal DIN and the complementary clock signal CKB input to the sampler may be significantly decreased, and reliability of the interface chip may be improved even in a high-speed operation.

Figure 20:
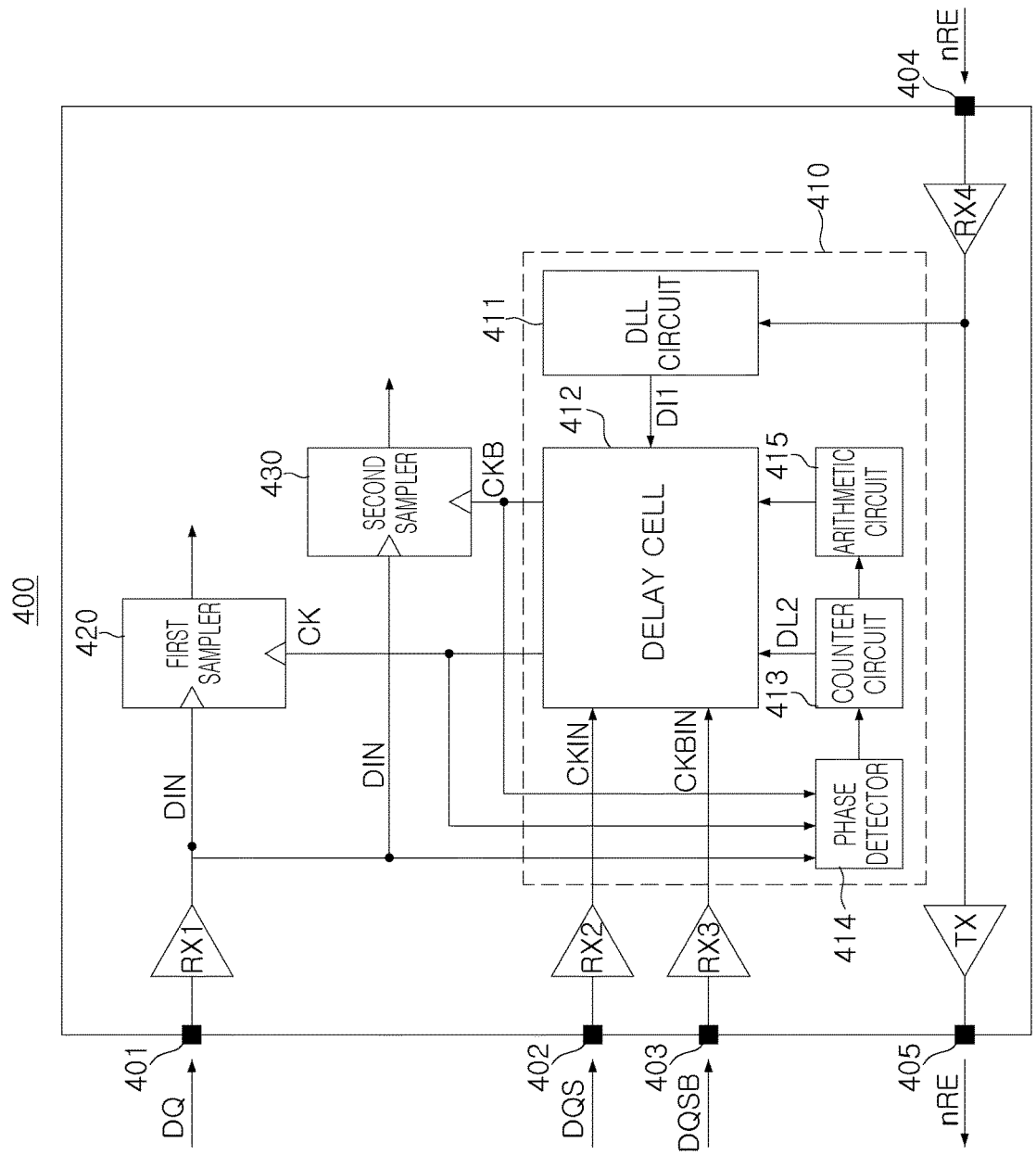
FIG. 20 is a schematic block diagram illustrating an interface chip according to an example embodiment.

FIG. 20 is a schematic block diagram illustrating an interface chip according to an example embodiment.

Referring to FIG. 20, an interface chip 400 according to an example embodiment may include a delay circuit 410, a first sampler 420, a second sampler 430, and the like. The interface chip 400 may be connected to other external devices (e.g., a controller, a host, or the like) through a plurality of pads 401 to 405. In an example embodiment illustrated in FIG. 20, a first receiver RX1 may receive a DQ signal from the memory chip through a first pad 401. A second receiver RX2 may receive a DQS signal through a second pad 402, and a third receiver RX3 may receive a DQSB signal through a third pad 403. A fourth receiver RX4 may receive a signal from the controller, the host, or the like, through a fourth pad 404, and a transmitter TX may transmit a signal to the memory chip through a fifth pad 405.

The first sampler 420 may sample a data signal DIN in synchronization with a clock signal CK generated by the DQS signal, and the second sampler 430 may sample the data signal DIN in synchronization with a complementary clock signal CKB generated by the DQSB signal.

The delay circuit 410 may include a delay locked loop circuit 411, a delay cell 412, a counter circuit 413, a phase detector 414, an arithmetic circuit 415, and the like. The delay locked loop circuit 411 may output a first delay code for generating a first delay DL1 with reference to the signal received by the fourth receiver RX4 from the controller or the host, for example, the read enable signal. The first delay DL1 may be determined regardless of a phase difference between the DQ signal and the DQS signal.

The phase detector 414 may detect a phase difference between the data signal DIN and the clock signal CK and a phase difference between the data signal DIN and the complementary clock signal CKB. The counter circuit 413 may output a second delay code for generating a second delay DL2 with reference to an output of the phase detector 414.

In an example embodiment illustrated in FIG. 20, skew adjustment between the data signal DIN and the clock signal CK and skew adjustment between the data signal DIN and the complementary clock signal CKB may be sequentially executed. As an example, skew between the data signal DIN and the clock signal CK may be first adjusted, and skew between the data signal DIN and the complementary clock signal CKB may be then adjusted. Alternatively, skew between the data signal DIN and the complementary clock signal CKB may be first adjusted, and skew between the data signal DIN and the clock signal CK may be then adjusted.

When a training operation is started by the controller, the host, or the like, the delay locked loop circuit 411 may output the first delay code corresponding to the first delay DL1 with reference to the read enable signal nRE. As an example, the first delay DL1 may correspond to ½ of one unit interval of the data signal.

The delay circuit 410 may first adjust skew between the clock signal CK generated by the DQS signal and the data signal DIN. As described above, the delay circuit 410 may generate a delay clock signal by applying the first delay DL1 and the second delay DL2 to a raw clock signal CKIN, and may set the second delay DL2 so that the delay clock signal has a phase difference corresponding to one unit interval of the data signal DIN from the data signal DIN. When the second delay DL2 is set, the delay circuit 410 may determine a phase of the clock signal CK by removing the first delay DL1 from the delay clock signal.

In an example embodiment illustrated in FIG. 20, when the phase of the clock signal CK is determined, the interface chip 400 may adjust a phase of the complementary clock signal CKB to significantly decrease the skew between the complementary clock signal CKB and the data signal DIN. An operation of adjusting the phase of the complementary clock signal CKB so as to significantly decrease the skew between the complementary clock signal CKB and the data signal DIN will hereinafter be described with reference to FIGS. 21 to 25.

FIGS. 21 to 25 are waveform diagrams illustrating operations of an interface chip according to example embodiments.

Figure 21:
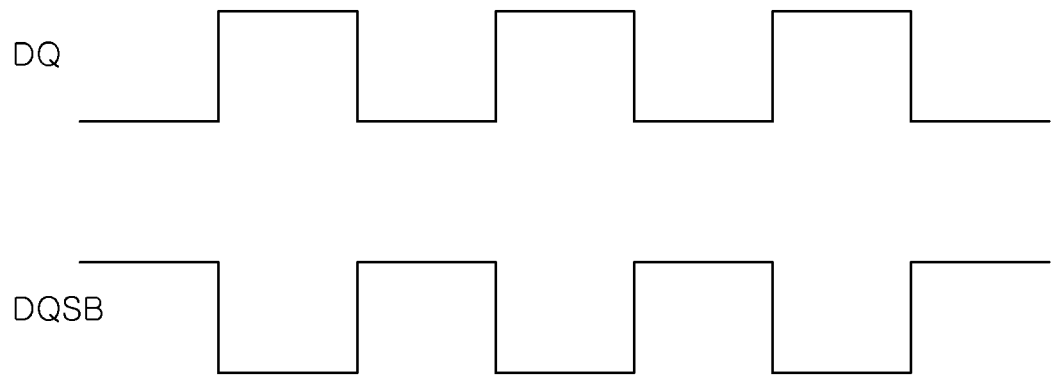
FIGS. 21 to 25 are waveform diagrams illustrating operations of an interface chip according to example embodiments.
Figure 22:
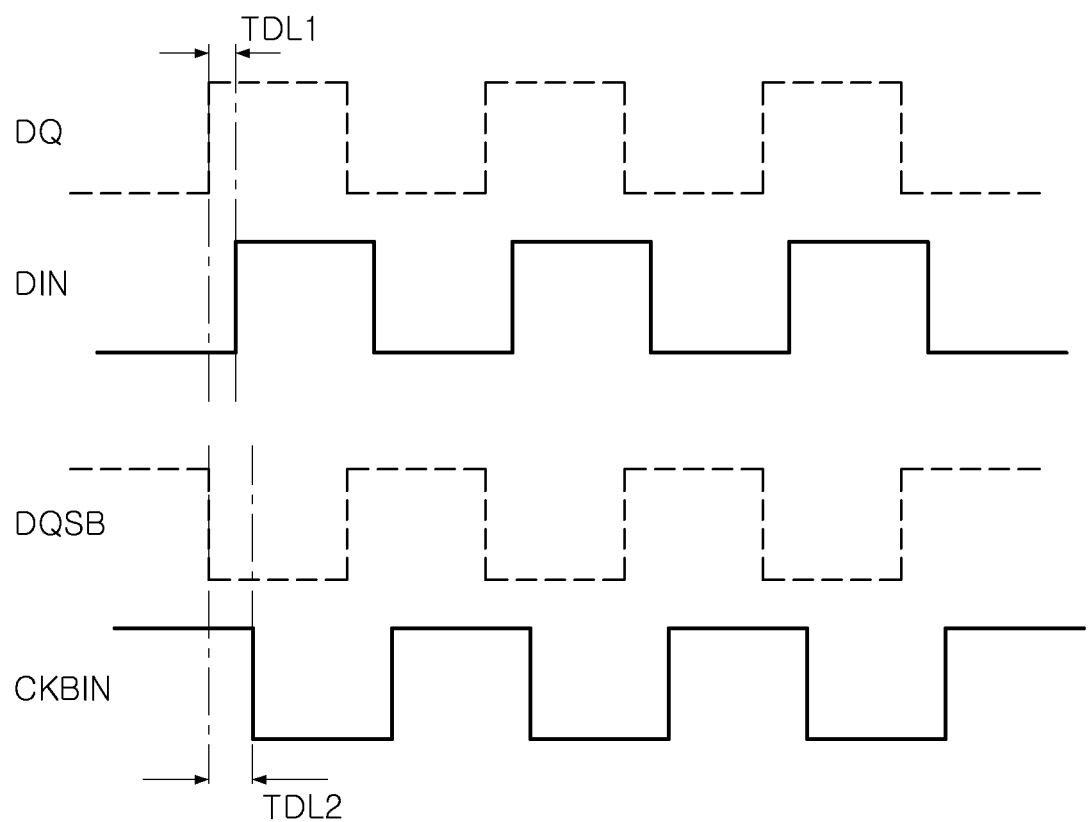

Referring to FIG. 21, the DQ signal may be a signal having a predetermined unit interval UI, and the DQSB signal may be a signal having an opposite phase to the DQ signal. The memory chip may output the DQS signal having the same phase as the DQ signal and output the DQSB signal having the opposite phase to the DQ signal.

A first default delay TDL1 generated in a transmission path between the first pad 401 and the second sampler 430 may be different from a second default delay TDL2 generated in a transmission path between the third pad 403 receiving the DQSB signal and the second sampler 430. In an example embodiment illustrated in FIG. 22, the first default delay TDL1 may be less than the second default delay TDL2.

Figure 23:
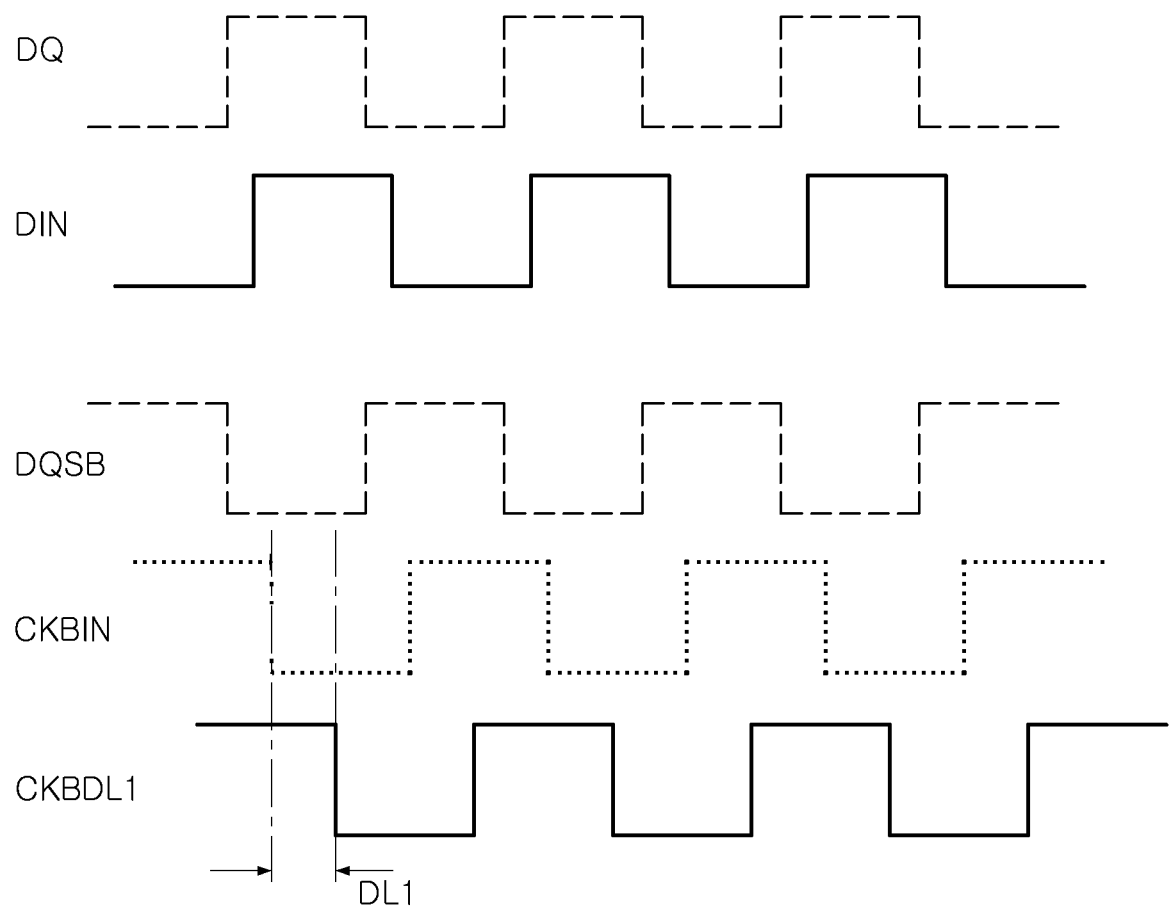

Referring to FIG. 23, the delay circuit 410 may generate a first complementary delay clock signal CKBDL1 by applying the first delay DL1 to a complementary raw clock signal CKBIN. The first delay DL1 may correspond to ½ of one unit interval UI of the data signal DIN. As an example, the delay locked loop circuit 411 may output the first delay code corresponding to the first delay DL1 to the delay cell 412, and the delay cell 412 may apply the first delay DL1 to the complementary raw clock signal CKBIN with reference to the first delay code. As the first delay DL1 is applied, a phase difference between the data signal DIN and the first complementary delay clock signal CKBDL1 may become greater than a phase difference between the data signal DIN and the complementary raw clock signal CKBIN.

The second sampler 430 may sample the data signal DIN in synchronization with the first complementary delay clock signal CKBDL1 while the delay cell 412 outputs the first complementary delay clock signal CKBDL1. The phase detector 414 may detect the phase difference between the first complementary delay clock signal CKBDL1 output from the delay cell 412 and the data signal DIN. A counter circuit 413 may output the second delay code for generating the second delay DL2 to the delay cell 412 with reference to the phase difference between the first complementary delay clock signal CKBDL1 and the data signal DIN. The delay cell 412 may generate the second delay DL2 with reference to the second delay code, and apply the second delay DL2 to the first complementary delay clock signal CKBDL1.

Figure 24:
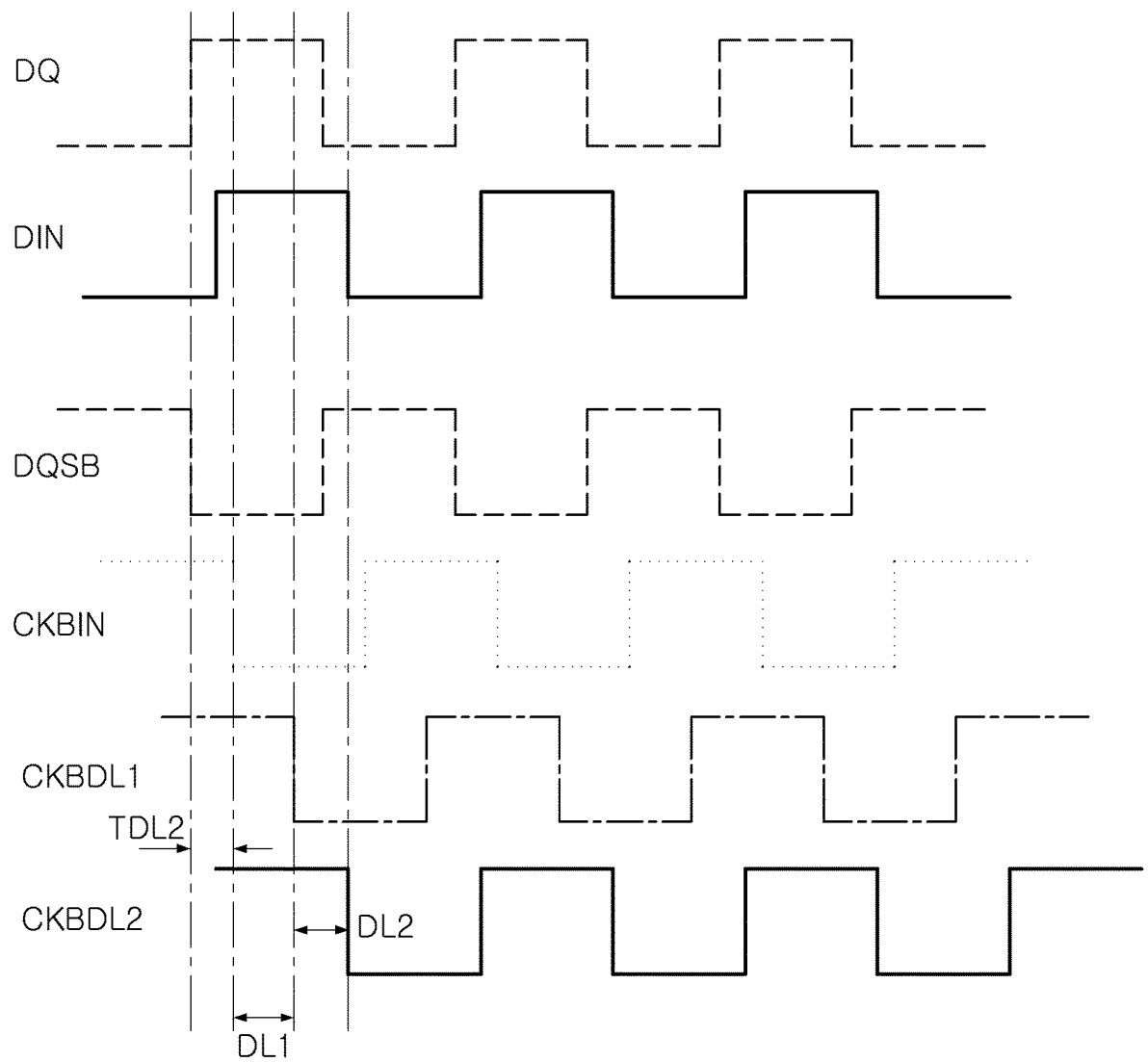

Referring to FIG. 24, the delay cell 412 may generate a second complementary delay clock signal CKBDL2 by additionally apply the second delay DL2 to the first complementary delay clock signal CKBDL1. The delay circuit 410 may adjust a value of the second delay DL2 so that a falling edge of the second complementary delay clock signal CKBDL2 coincides with a falling edge of the data signal DIN.

Figure 25:
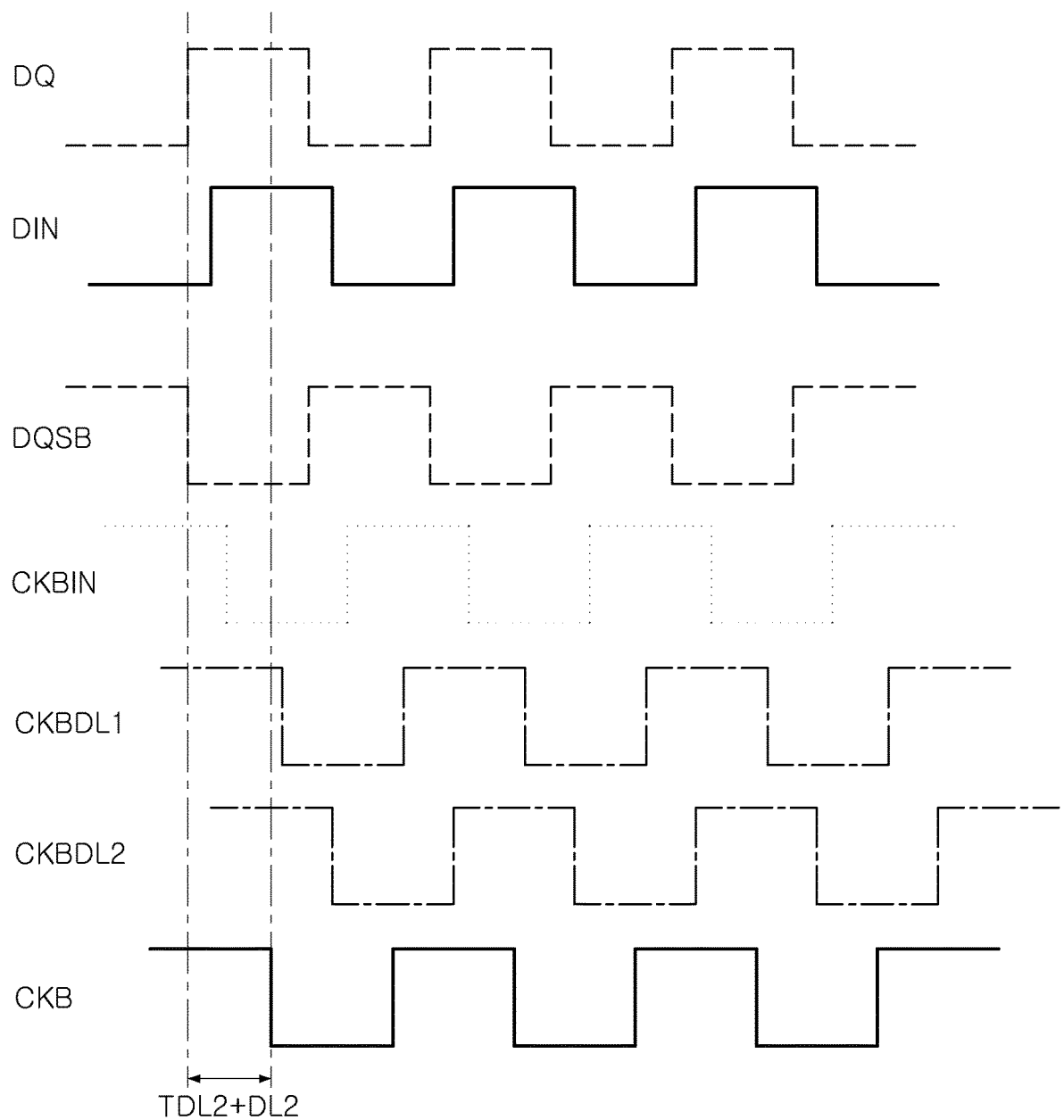

As illustrated in FIG. 24, when the second complementary delay clock signal CKBDL2 and the data signal DIN has the same phase, the delay circuit may remove the first delay DL1 from the second complementary delay clock signal CKBDL2. Referring to FIG. 25, the delay cell 412 may generate the complementary clock signal CKB by removing the first delay DL1 from the second complementary delay clock signal CKBDL2. The complementary clock signal CKB may have a phase difference corresponding to a delay obtained by adding the second default delay TDL2 and the second delay DL2, from DQSB signal received through the third pad 403. For example, the complementary clock signal CKB may have a phase difference corresponding to a delay obtained by adding a phase difference corresponding to a delay difference between the data signal DIN and the complementary raw clock signal CKBIN from the data signal DIN. The phase difference corresponding to the delay difference may correspond to a delay of (TDL2−TDL1). For example, a sum of the delay difference and the second delay DL2 may correspond to ½ of one unit interval UI of the data signal DIN.

Since the first delay DL1 corresponding to a time of ½ of one unit interval of the data signal DIN is removed from the second complementary delay clock signal CKBDL2 having the phase difference corresponding to one unit interval of the data signal DIN from the data signal DIN, a rising edge or a falling edge of the complementary clock signal CKB may be accurately aligned within one unit interval of the data signal DIN. Accordingly, skew between the data signal DIN and the complementary clock signal CKB input to the second sampler 430 may be significantly decreased, and reliability of the interface chip 400 may be improved even in a high-speed operation.

In an example embodiment, the phases of the DQS signal and the DQSB signal received by the interface chip 400 may be individually adjusted. In an actual operating environment, duty ratios of the DQS signal and the DQSB signal input to the interface chip 400 may not be accurately set to 50%. As an example, the duty ratio of the DQS signal may be set to a value greater than 50%, and the duty ratio of the DQSB signal may be set to a value less than 50%.

In this case, the second delay DL2 for the DQS signal and the second delay DL2 for the DQSB signal may have different values. In the interface chip 400 according to an example embodiment, in consideration of the difference between the duty ratio of the DQS signal and the duty ratio of the DQSB signal, an average value of the second delay DL2 for the DQS signal and the second delay DL2 for the DQSB signal may be calculated, and may be applied to the DQS signal and the DQSB signal. A description hereinafter will be provided with reference to FIGS. 26 to 28.

Figure 26:
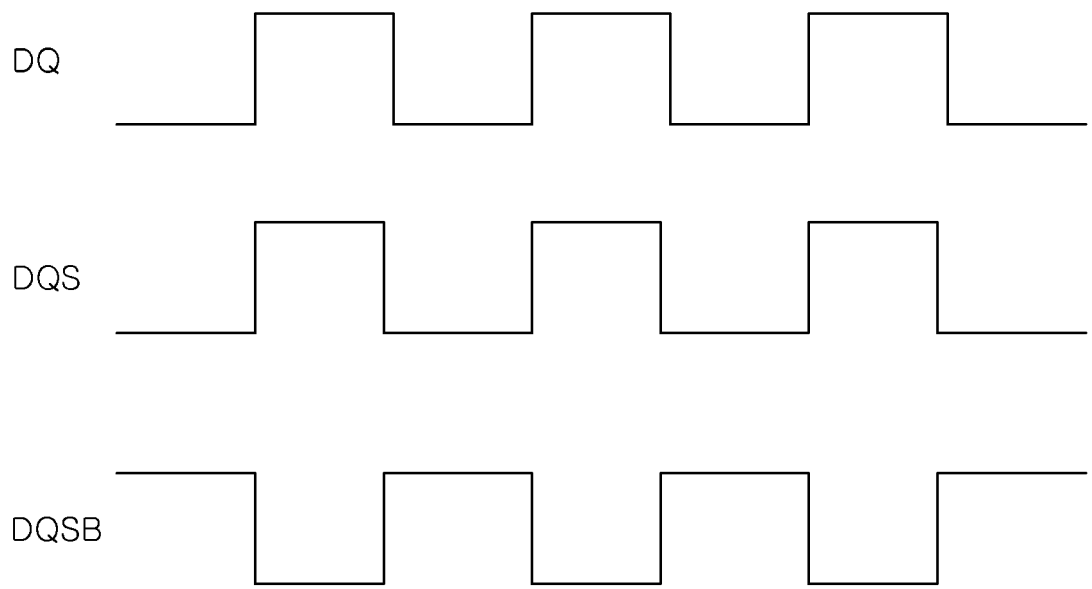
FIGS. 26 to 28 are waveform diagrams illustrating operations of an interface chip according to example embodiments.
Figure 27:
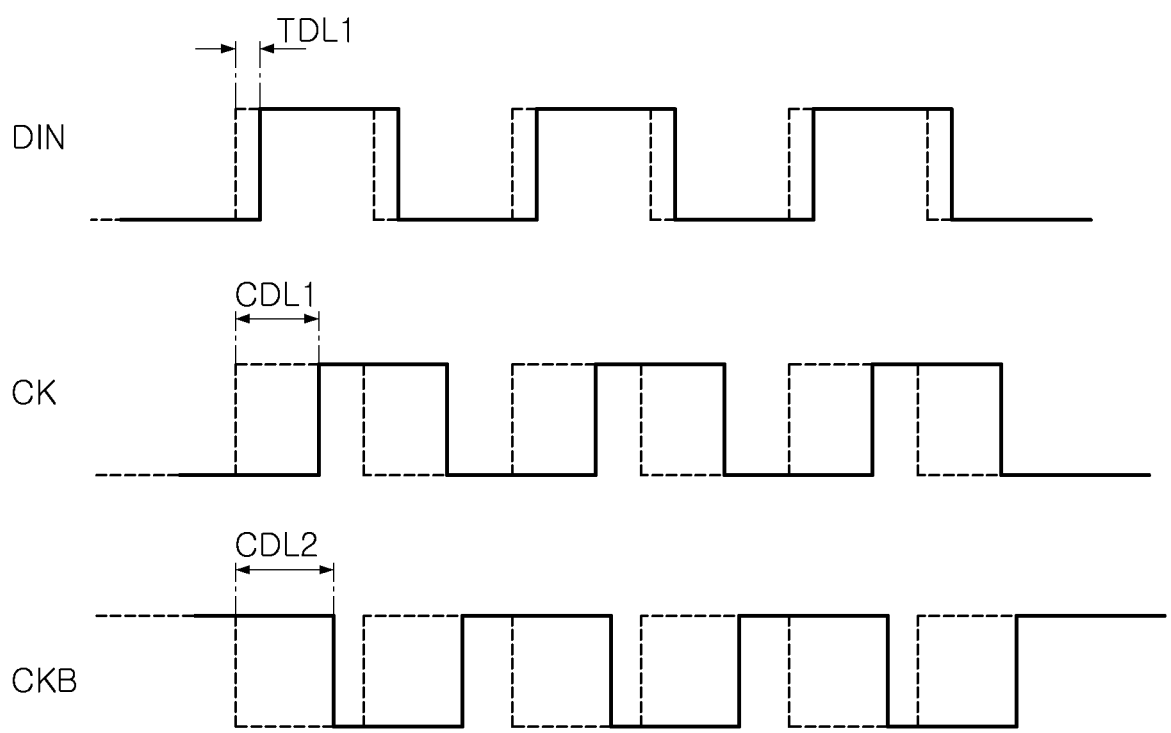
Figure 28:
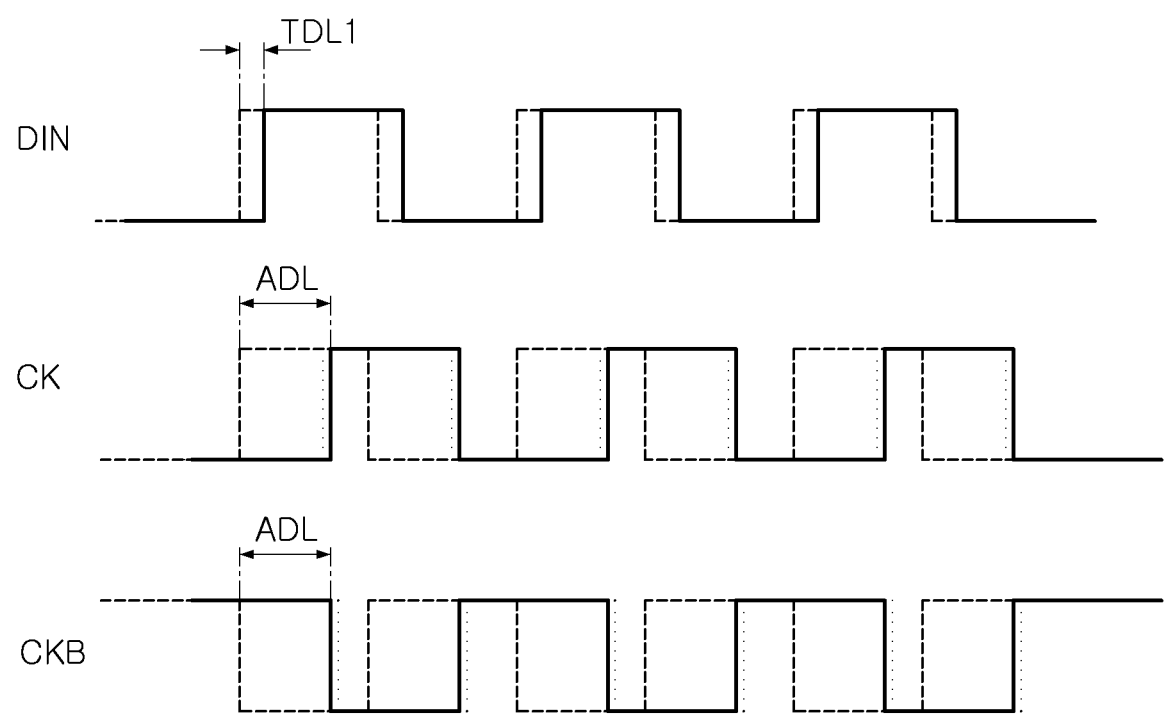

FIGS. 26 to 28 are waveform diagrams illustrating operations of an interface chip according to an example embodiment.

Referring to FIG. 26, the DQ signal may be a signal having a predetermined unit interval UI, and the DQS signal and the DQSB signal may have opposite phases to each other. The DQ signal and the DQS signal may have the same phase. A duty ratio of the DQ signal may be 50%, the duty ratio of the DQS signal may be less than 50%, and the duty ratio of the DQSB signal may be greater than 50%.

Referring to FIG. 27, the DQ signal may be delayed by the first default delay TDL1 existing in a transmission path in the interface chip and be input to the first sampler and the second sampler as the data signal DIN. The DQS signal may be delayed by a first clock delay CDL1 by the delay cell of the interface chip and may be input to the first sampler as a clock signal CK. The DQSB signal may be delayed by a second clock delay CDL2 by the delay cell and may be input to the second sampler as a complementary clock signal CKB.

A method of determining each of the first clock delay CDL1 and the second clock delay CDL2 may be understood with reference to one of the above-described example embodiments. As an example, a signal having a phase difference corresponding to one unit interval UI from the data signal DIN may be generated by applying an offset delay corresponding to ½ of one unit interval UI of the DQ signal and an additional delay to the DQS signal. The delay cell included in the interface chip may generate the clock signal CK of which skew with the data signal DIN is significantly decreased by generating the signal having the phase difference corresponding to one unit interval UI from the data signal DIN with reference to the first delay code corresponding to the offset delay and the second delay code corresponding to the additional delay and removing the offset delay from the generated signal again. The first clock delay CDL1 may correspond to the sum of the additional delay corresponding to the second delay code and a delay existing in a transmission path through which the DQS signal is transmitted within the interface chip.

The second clock delay CDL2 may also be determined in a similar manner to the first clock delay CDL1. The delay cell included in the interface chip may generate the complementary clock signal CKB of which skew with the data signal DIN is significantly decreased by generating the signal having the phase difference corresponding to one unit interval UI from the data signal DIN with reference to the first delay code corresponding to the offset delay and a third delay code corresponding to the additional delay and removing the offset delay from the generated signal. The third delay code may be the same as or different from the second delay code. As an example, the second clock delay CDL2 may correspond to the sum of the additional delay corresponding to the third delay code and the delay existing in the transmission path through which the DQS signal is transmitted within the interface chip.

However, since the duty ratios of the DQS signal and the DQSB signal are different from each other, the first clock delay CDL1 and the second clock delay CDL2 may also be different from each other. In an example embodiment, the arithmetic circuit 415 included in the interface chip may calculate an average code of the second delay code and the third delay code, and generate the clock signal CK and the complementary clock signal CKB using a delay ADL corresponding to the average code. Referring to FIG. 28, the delay ADL corresponding to the average code may be commonly applied to the clock signal CK and the complementary clock signal CKB. The delay ADL corresponding to the average code may have an average value of the first clock delay CDL1 and the second clock delay CDL2.

Figure 29:
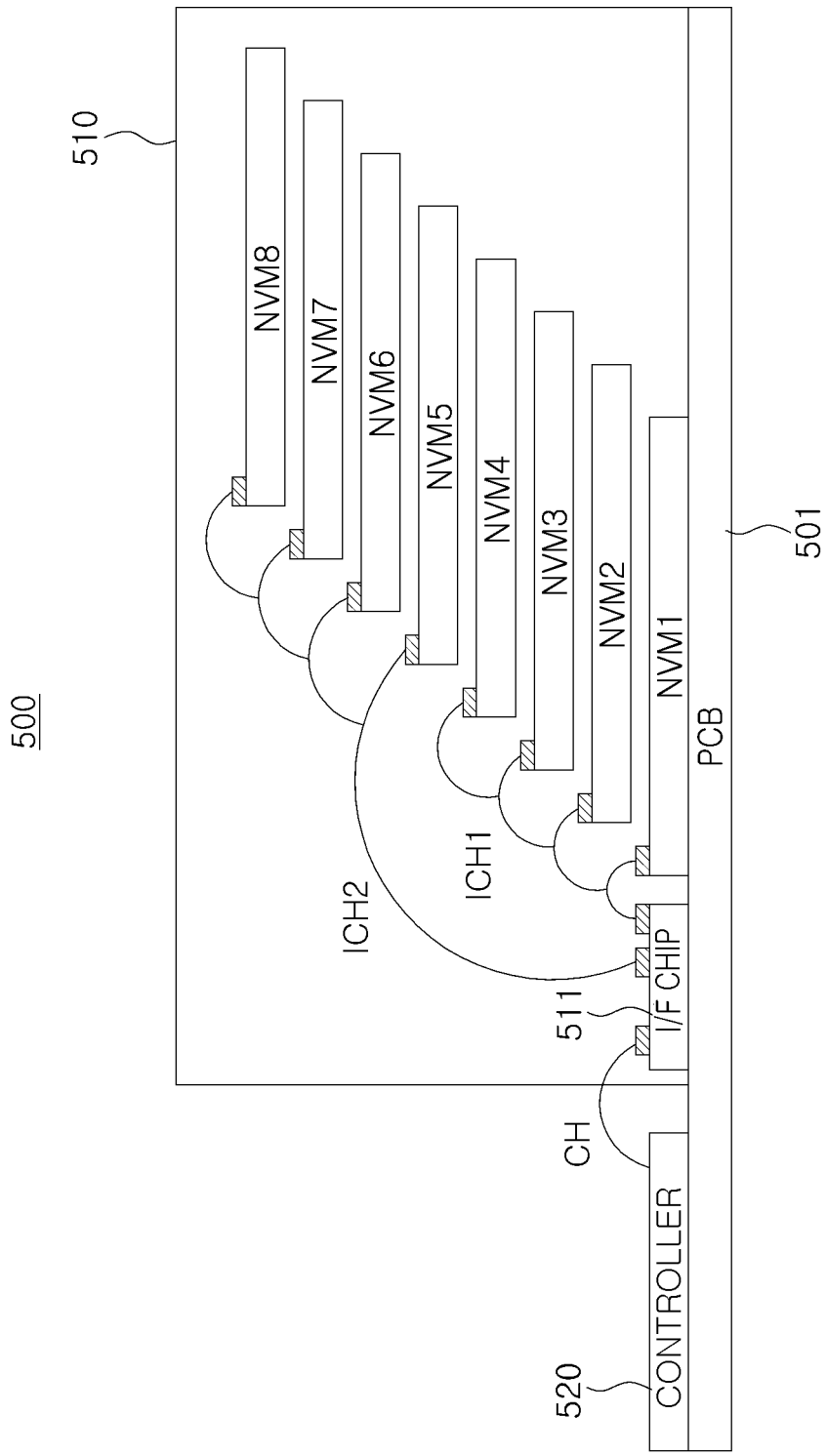
FIG. 29 is a schematic diagram illustrating a storage device according to an example embodiment.

FIG. 29 is a schematic diagram illustrating a storage device according to an example embodiment.

FIG. 29 is an illustrative view illustrating a storage device 500 according to an example embodiment, and the storage device 500 may include a memory package 510 and a controller 520. The memory package 510 includes an interface chip 511 and a plurality of memory chips NVM1 to NVM8, and the plurality of memory chips NVM1 to NVM8 may be stacked.

Referring to FIG. 29, the memory package 510 and the controller 520 may be mounted on a circuit board (or printed circuit board (PCB)) 501. The controller 520 may be connected to the interface chip 511 included in the memory package 510 through a wiring in the circuit board 501. The interface chip 511 and the controller 520 may exchange signals with each other through a channel CH provided by the wiring of the circuit board 501.

The plurality of memory chips NVM1 to NVM8 connected to the interface chip 511 in the memory package 510 may be divided into a plurality of groups. As an example, first to fourth memory chips NVM1 to NVM4 connected to the interface chip 511 through first internal channels ICH1 may be divided into a first group, and fifth to eighth memory chips NVM5 to NVM8 connected to the interface chip 511 through second internal channels ICH2 may be divided into a second group.

In an example embodiment illustrated in FIG. 29, it has been illustrated that the fifth to eighth memory chips NVM5 to NVM8 included in the second group are disposed above the first to fourth memory chips NVM1 to NVM4 included in the first group, but an example embodiment is not necessarily limited thereto. In addition, it has been illustrated in FIG. 29 that the interface chip 511 is disposed on one side of the memory chips NVM1 to NVM8, but the interface chip 511 may also be stacked together with the memory chips NVM1 to NVM8.

Referring to FIG. 29, the memory chips NVM1 to NVM8 and the interface chip 511 may be connected to each other through the internal channels ICH1 and ICH2 provided by wires. However, this is only an example, and the memory chips NVM1 to NVM8 and the interface chip 511 may also be connected to each other by via structures penetrating through the memory chips NVM1 to NVM8 and the interface chip 511.

When power is supplied to the storage device 500 and an operation of the storage device 500 is started, the controller 520 may execute a training operation for the memory package 510. The training operation may include ZQ training, DCC training, read training, write training, and the like. While the memory package 510 executes a DCC training operation under the control of the controller 520, the interface chip 511 may remove skews between data signals and clock signals received from the memory chips NVM1 to NVM8 through the internal channels ICH1 and ICH2.

According to an example embodiment, when the interface chip 511 fails to remove the skews between the data signals and the clock signals and to optimize phases of the data signals and the clock signals while the DCC training operation is executed, the interface chip 511 may additionally execute an operation of removing the skews between the data signals and the clock signals while a read training operation is executed. As described above, while the skews between the data signals and the clock signals are removed in the interface chip 511, the memory chips NVM1 to NVM8 may output DQ signals transitioning from a high level to a low level for each unit interval through the internal channels ICH1 and ICH2.

The interface chip 511 includes a sampler sampling the data signal in synchronization with the clock signal, and the sampler may adjust a phase of the clock signal so that the skew between the data signal and the clock signal is significantly decreased. As an example, a delay clock signal may be generated by applying an offset delay and an additional delay to the clock signal, and the additional delay may be adjusted so that the delay clock signal has a phase difference corresponding to a unit interval of the data signal from the data signal. When the delay clock signal has the phase difference corresponding to one unit interval of the data signal from the data signal by adjusting the additional delay, a signal obtained by removing the offset delay from the delay clock signal may be determined as a clock signal and output to a sampler. The offset delay may correspond to ½ of one unit interval of the data signal. Accordingly, a rising edge and/or a falling edge of the clock signal may be accurately positioned near the center of the unit interval of the data signal by the method as described above.

According to an example embodiment, in order to remove skew between a data signal and a clock signal that a memory chip exchanges with another semiconductor device, an offset delay corresponding to ½ of one unit interval of the data signal and an additional delay set separately from the offset delay may be applied to the clock signal. When the clock signal to which the offset delay and the additional delay are applied has a phase difference corresponding to the unit interval of the data signal from the data signal, the skew between the data signal and the clock signal may be significantly decreased by removing the offset delay from the clock signal.

The present inventive concept is not limited by the example embodiments described above and the accompanying drawings, but is intended to be limited by the appended claims. Therefore, various types of substitutions, modifications, and alterations may be made by those skilled in the art without departing from the spirit of the present inventive concept as defined by the appended claims, and these substitutions, modifications, and alterations are to be fall within the scope of the present inventive concept.

What is claimed is:

1. A memory package comprising:
a plurality of memory chips; and
an interface chip configured to relay communications between a controller and the plurality of memory chips and receive a plurality of signals from the plurality of memory chips,
wherein the interface chip includes:
a first receiver configured to output a data signal based on a first signal of the plurality of signals;
a second receiver configured to output a raw clock signal based on a second signal of the plurality of signals;
a delay circuit configured to output a delay clock signal by applying an offset delay corresponding to ½ of one unit interval of the data signal and an additional delay to the raw clock signal, and output a clock signal generated by removing the offset delay from the delay clock signal when the delay clock signal and the data signal have a phase difference corresponding to one unit interval of the data signal; and
a sampler configured to sample the data signal in synchronization with the clock signal output from the delay circuit.

2. The memory package of claim 1, wherein the delay circuit includes:
a delay locked loop circuit configured to output a first delay code corresponding to the offset delay;
a counter circuit configured to output a second delay code corresponding to the additional delay; and
a delay cell configured to apply the offset delay and the additional delay to the raw clock signal based on the first delay code and the second delay code, and output the clock signal by applying only the additional delay to the raw clock signal when the delay clock signal and the data signal have the phase difference corresponding to one unit interval of the data signal.

3. The memory package of claim 2, wherein the delay circuit further includes:
a phase detector configured to detect a phase difference between the data signal and the delay clock signal input to the sampler; and
the counter circuit configured to determine the additional delay based on an output of the phase detector.

4. The memory package of claim 2, wherein the counter circuit is configured to determine the additional delay based on an output of the sampler while the data signal and the delay clock signal are input to the sampler.

5. The memory package of claim 1, wherein the additional delay is less than the offset delay.

6. The memory package of claim 1, wherein the first receiver is configured to output the data signal by delaying an amount of a first default delay from the first signal,
wherein the second receiver is configured to output the raw clock signal by delaying an amount of a second default delay from the second signal, and
wherein a sum of a delay difference between the first default delay and the second default delay and the additional delay corresponds to ½ of one unit interval.

7. The memory package of claim 1, wherein the raw clock signal is a data strobe signal.

8. The memory package of claim 1, wherein the data signal is a toggle signal repeatedly transitioning between a high level and a low level for each unit interval.

9. The memory package of claim 8, wherein the plurality of memory chips are configured to output the plurality of signals as toggle signals during a duty cycle correction (DCC) training period of the memory package.

10. The memory package of claim 9, wherein the plurality of memory chips are configured to output the plurality of signals during at least a portion of a read training period of the memory package after the DCC training period.

11. A semiconductor device comprising:
a first receiver configured to output a data signal based on a first input signal received from outside the semiconductor device;
a second receiver configured to output a raw clock signal based on a second input signal received from outside the semiconductor device;
a delay locked loop circuit configured to output a first delay code;
a first sampler configured to sample the data signal in synchronization with a clock signal;

a counter circuit configured to output a second delay code generated based on a signal detected in at least one of an input terminal and an output terminal of the first sampler; and a delay cell configured to output a delay clock signal generated by delaying the raw clock signal by applying delays determined based on the first delay code and the second delay code, and output the clock signal generated by removing a delay according to the first delay code from the delay clock signal when a phase difference between the data signal and the delay clock signal corresponds to one unit interval of the data signal.

12. The semiconductor device of claim 11, further comprising:
a phase detector configured to detect a phase of each of the data signal and the delay clock signal at each input terminal of the first sampler and transmit the detected phase to the counter circuit.

13. The semiconductor device of claim 11, wherein the counter circuit connected to the output terminal of the first sampler is configured to determine the second delay code with reference to a first sampler output signal from the first sampler while the first sampler samples the data signal in synchronization with the delay clock signal.

14. The semiconductor device of claim 13, wherein the first sampler is configured to output the first sampler output signal being a toggle signal repeatedly transitioning between a high level and a low level.

15. The semiconductor device of claim 11, wherein the delay determined based on the first delay code corresponds to ½ of one unit interval of the data signal.

16. The semiconductor device of claim 11, wherein the delay determined based on the second delay code is less than ½ of one unit interval of the data signal.

17. The semiconductor device of claim 11, further comprising:
a third receiver configured to output a complementary raw clock signal having a phase difference of 180° from the raw clock signal based on a third input signal received from outside the semiconductor device; and
a second sampler configured to sample the data signal in synchronization with a complementary clock signal output from the delay cell,
wherein the delay cell further configured to output a complementary delay clock signal generated by delaying the complementary raw clock signal by applying delays determined based on the first delay code and a third delay code generated from the counter circuit, and output a complementary clock signal generated by removing a delay based on the first delay code from the complementary delay clock signal when the data signal and the complementary delay clock signal have the same phase.

18. The semiconductor device of claim 17, wherein the second delay code is different from the third delay code, and
wherein the delay cell is configured to output the clock signal and the complementary clock signal using a delay based on an average code corresponding to an average of the second delay code and the third delay code.

19. A storage device comprising:
a controller configured to sequentially execute a plurality of training operations;
a memory chip configured to output a first signal and a second signal having the same phase through a first pad and a second pad, respectively, while at least one of the training operations is executed; and
an interface chip connected between the controller and the memory chip, and the interface chip including:
a first receiver configured to output a data signal based on the first signal;
a second receiver configured to output a raw clock signal based on the second signal;
a first sampler configured to sample the data signal in synchronization with a clock signal; and
a delay circuit configured to:
output a delay clock signal by applying a first delay code corresponding to a first delay determined regardless of a phase difference between the data signal and the delay clock signal detected at a respective input terminal of the first sampler and applying a second delay code corresponding to a second delay determined based on the phase difference between the data signal and the delay clock signal detected at the respective input terminal of the first sampler, and
output the clock signal by removing the first delay from the delay clock signal when the delay clock signal and the data signal have a phase difference corresponding to one unit interval of the data signal.

20. The storage device of claim 19, wherein the first delay is determined based on a period of a read enable signal transmitted from the controller to the interface chip while the at least one of the training operations is executed.

* * * * *